(12) United States Patent
Ikeda et al.

(10) Patent No.: US 8,431,432 B2
(45) Date of Patent: Apr. 30, 2013

(54) MANUFACTURING METHOD OF LIGHT-EMITTING DEVICE

(75) Inventors: Hisao Ikeda, Kanagawa (JP); Tomoya Aoyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 700 days.

(21) Appl. No.: 12/058,169

(22) Filed: Mar. 28, 2008

(65) Prior Publication Data

US 2008/0268561 A1    Oct. 30, 2008

(30) Foreign Application Priority Data

Apr. 27, 2007    (JP) .................................. 2007-119996

(51) Int. Cl.
*H01L 51/56*    (2006.01)
(52) U.S. Cl.
USPC ........... 438/99; 427/66; 427/70; 257/E51.001
(58) Field of Classification Search ............ 427/66, 427/69–70; 438/99; 257/40, E51.001–E51.052
See application file for complete search history.

(56) References Cited

U.S. PATENT DOCUMENTS

| | | | |
|---|---|---|---|
| 5,688,551 A | 11/1997 | Littman et al. | |
| 5,937,272 A | 8/1999 | Tang | |
| 6,140,009 A | 10/2000 | Wolk et al. | |
| 6,165,543 A | 12/2000 | Otsuki et al. | |
| 6,242,152 B1 | 6/2001 | Staral et al. | |
| 6,797,314 B2 * | 9/2004 | Van Slyke et al. ............ | 427/66 |
| 7,090,890 B1 | 8/2006 | Sturm et al. | |
| 7,332,857 B2 | 2/2008 | Seo et al. | |
| 7,842,341 B2 * | 11/2010 | Boroson et al. ............ | 427/248.1 |
| 7,959,993 B2 | 6/2011 | Lee | |
| 2001/0004469 A1 | 6/2001 | Himeshima et al. | |

(Continued)

FOREIGN PATENT DOCUMENTS

| | | |
|---|---|---|
| CN | 1336441 A | 2/2002 |
| CN | 1441080 A | 9/2003 |

(Continued)

OTHER PUBLICATIONS

Shtein, M., et al. "Micropatterning of Small Molecular Weight Organic Semiconductor Thin Films Using Organic Vapor Phase Deposition." J. Appl. Phys., vol. 93, No. 7 (Apr. 1, 2003): pp. 4005-4016.*

(Continued)

*Primary Examiner* — Jenny L Wagner
*Assistant Examiner* — Mark Tornow
(74) *Attorney, Agent, or Firm* — Husch Blackwell LLP

(57) ABSTRACT

An object is to provide a manufacturing method of a light-emitting device including an organic compound layer, in which a desired organic compound layer is easily formed using a plurality of evaporation materials. A first organic compound layer containing a plurality of evaporation materials is formed over a first substrate. The first organic compound layer is formed using a mixture formed by mixture of the plurality of evaporation materials in advance. A second substrate is placed at a position facing the first substrate so as to face the first organic compound layer provided for the first substrate. The first organic compound layer as an evaporation source is heated to be vaporized and a desired second organic compound layer is formed over the second substrate placed so as to face the first substrate. Accordingly, a light-emitting device is manufactured.

16 Claims, 15 Drawing Sheets

U.S. PATENT DOCUMENTS

| | | | |
|---|---|---|---|
| 2001/0051207 A1 | 12/2001 | Yamagata et al. | |
| 2002/0139303 A1 | 10/2002 | Yamazaki et al. | |
| 2003/0162314 A1* | 8/2003 | Yamazaki et al. | 438/46 |
| 2004/0016907 A1* | 1/2004 | Shi | 252/301.16 |
| 2004/0031442 A1 | 2/2004 | Yamazaki et al. | |
| 2004/0209119 A1 | 10/2004 | Seo et al. | |
| 2005/0056969 A1* | 3/2005 | Ghosh et al. | 264/442 |
| 2005/0266152 A1 | 12/2005 | Nguyen et al. | |
| 2006/0110526 A1* | 5/2006 | Ng et al. | 427/66 |
| 2006/0273713 A1 | 12/2006 | Mehta et al. | |
| 2007/0054051 A1 | 3/2007 | Arai et al. | |
| 2008/0074034 A1* | 3/2008 | Jou | 313/504 |
| 2008/0260938 A1 | 10/2008 | Ikeda et al. | |
| 2008/0268135 A1 | 10/2008 | Yokoyama et al. | |
| 2008/0268137 A1 | 10/2008 | Ikeda et al. | |
| 2009/0011677 A1 | 1/2009 | Ikeda et al. | |
| 2009/0074952 A1 | 3/2009 | Yamazaki et al. | |

FOREIGN PATENT DOCUMENTS

| | | |
|---|---|---|
| EP | 0 851 714 A2 | 7/1998 |
| EP | 0 883 190 A2 | 12/1998 |
| EP | 1 156 536 A2 | 11/2001 |
| EP | 1 338 673 A1 | 8/2003 |
| JP | 9-232077 | 9/1997 |
| JP | 10-208881 | 8/1998 |
| JP | 11-54275 | 2/1999 |
| JP | 2000-77182 | 3/2000 |
| JP | 2002-25770 | 1/2002 |
| JP | 2004-43965 | 2/2004 |
| JP | 2004-288439 | 10/2004 |
| JP | 2006-148045 | 6/2006 |

OTHER PUBLICATIONS

Hwang, C., "47.3: Plane Source and In-Line Deposition System for OLED Manufacturing," Society for Information Display, 2006 International Symposium Digest of Technical Papers, SID 06 Digest, vol. XXXVII, Book II, Jun. 7-9, 2006, pp. 1567-1570.

Office Action re Chinese application No. CN 200810090709.X, dated Dec. 9, 2010 (with English translation).

* cited by examiner

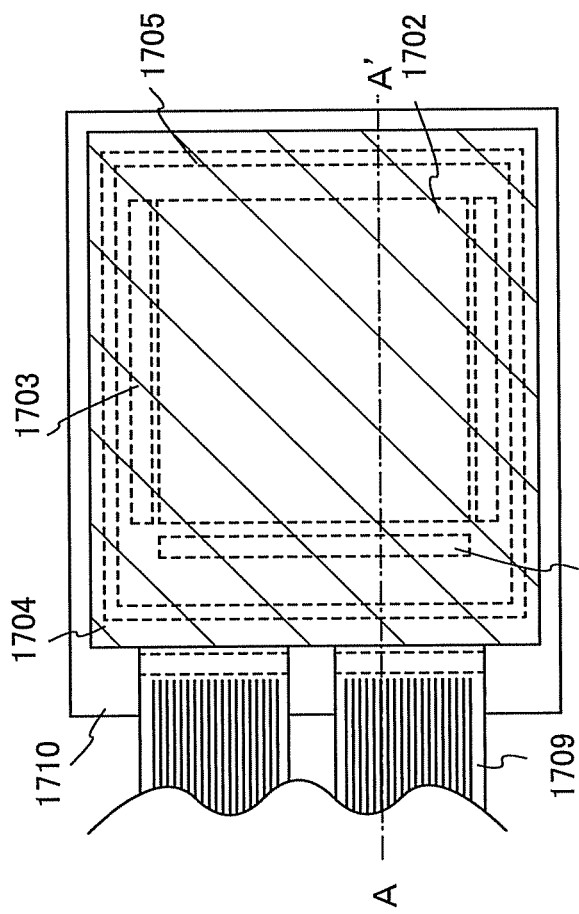
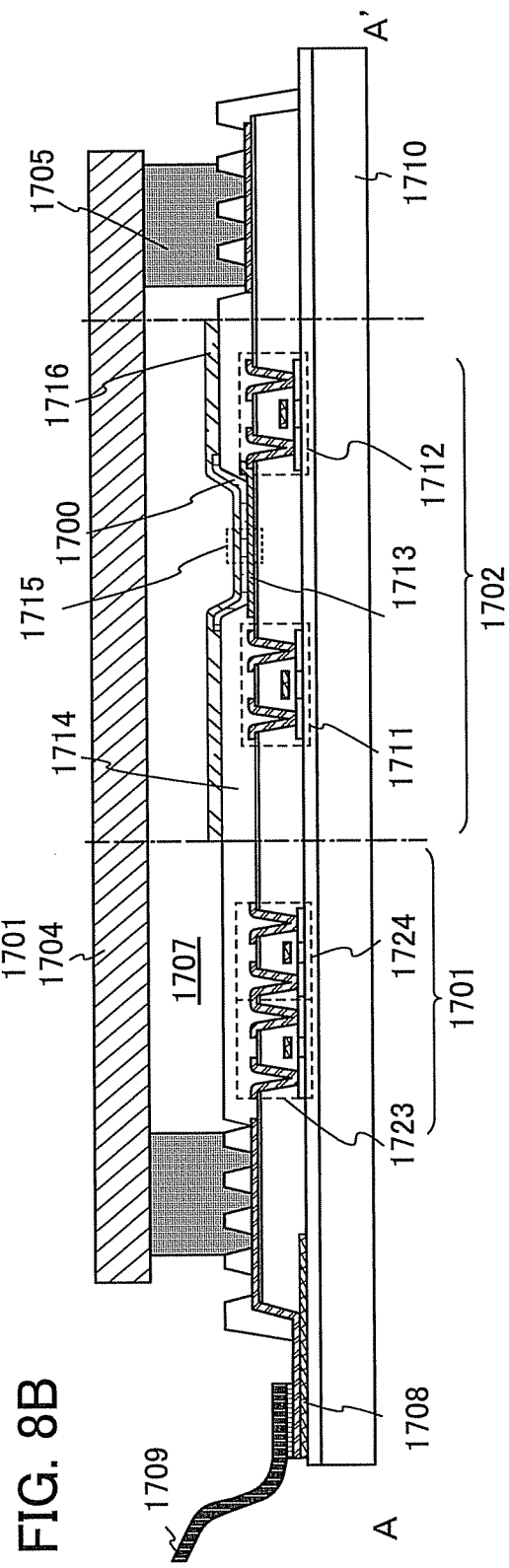
FIG. 8A
FIG. 8B

FIG. 11A
FIG. 11B
FIG. 11C
FIG. 11D
FIG. 11E
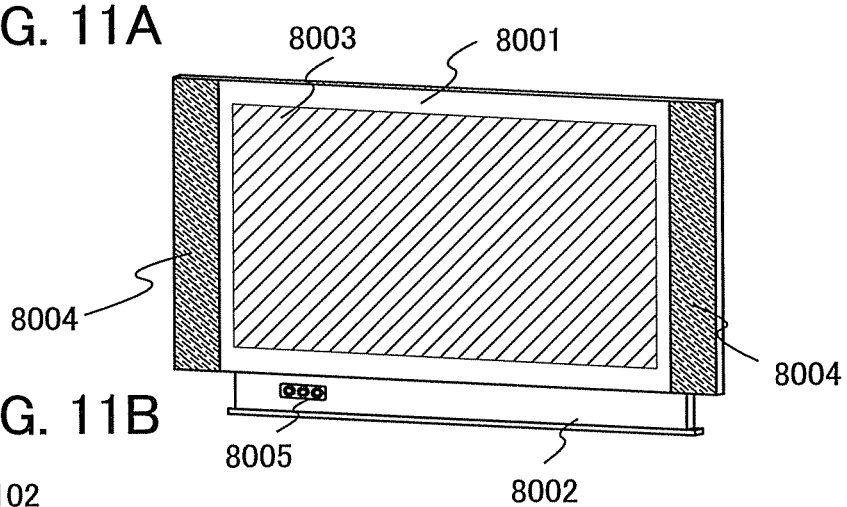
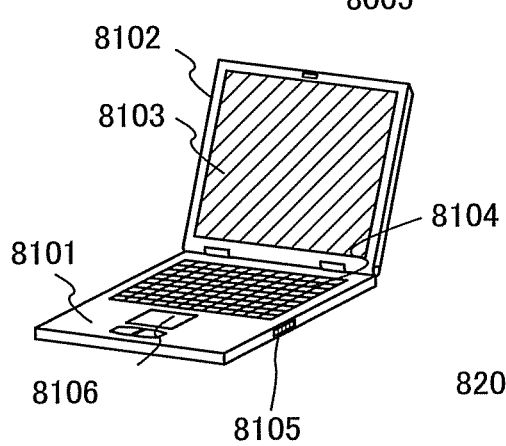
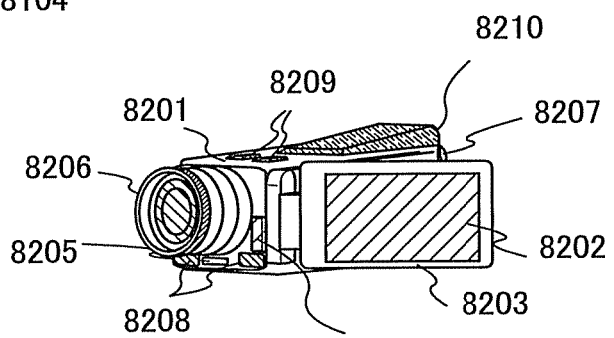
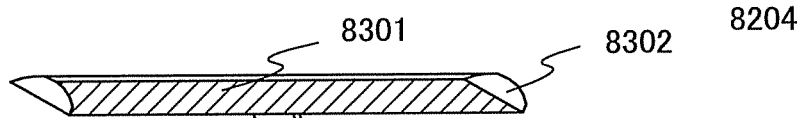
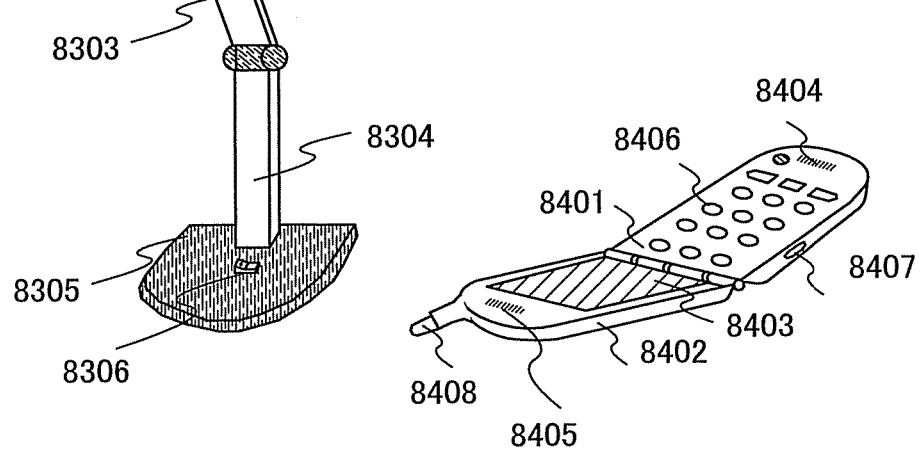

MANUFACTURING METHOD OF LIGHT-EMITTING DEVICE

BACKGROUND OF THE INVENTION

1. Field of the Invention

The present invention relates to a light-emitting device and a manufacturing method of the light-emitting device.

2. Description of the Related Art

A light-emitting element using an organic compound as a luminous body, which has characteristics such as thinness, lightness in weight, high-speed response, and DC drive at low voltage, is considered to be applied to a next-generation flat panel display. In particular, a display device in which light-emitting elements are arranged in matrix is considered to have an advantage in a wide viewing angle and excellent visibility over a conventional liquid crystal display device.

It is said that, as for a light-emitting mechanism of the light-emitting element in which a layer containing an organic compound (hereinafter, referred to as an organic compound layer) is used as a light-emitting layer, voltage is applied between a pair of electrodes where an organic compound layer is interposed, and thus electrons injected from a cathode and holes injected from an anode are recombined in the organic compound layer to form molecular excitons, and the molecular excitons release energy when returning to a ground state, whereby light is emitted. Singlet excitation and triplet excitation are known as excited states, and it is thought that light emission can be achieved through either of the excited states.

An organic compound layer included in a light-emitting element includes at least a light-emitting layer. In addition, the organic compound layer can have a stacked-layer structure including a hole injecting layer, a hole transporting layer, an electron transporting layer, an electron injecting layer, and/or the like, in addition to the light-emitting layer.

Although a light-emitting layer can be formed of only a light-emitting material, it is known that the light-emitting layer is formed of a combination of a host material and a dopant material so that desired characteristics of emission wavelength, emission efficiency, and the like are obtained. For example, the present applicant discloses a light-emitting element containing a host material and a dopant material in Patent Document 1 (Japanese Published Patent Application No. 2004-288439).

In addition, an EL material for forming an organic compound layer is broadly classified into a low molecular (monomer) material and a high molecular (polymer) material. A low molecular material is generally evaporated using an evaporation apparatus. A conventional evaporation apparatus, in which a substrate is set on a substrate holder, includes a crucible (or a deposition boat) in which an EL material, that is, an evaporation material is contained; a shutter for preventing the EL material to be sublimated from rising; and a heater for heating the EL material in the crucible. Then, the EL material which is heated by the heater is sublimated, whereby the EL material is evaporated over the substrate. For example, the present applicant discloses a evaporation apparatus which is capable of moving an evaporation source relative to a substrate in Patent Document 2 (Japanese Published Patent Application No. 2004-043965).

SUMMARY OF THE INVENTION

In the case where an organic compound layer containing a host material and a dopant material is formed using a conventional evaporation apparatus, a method is known in which a host material is put in a plurality of crucibles and a dopant material is put in a plurality of crucibles and they are co-evaporated. In the case where a light-emitting layer is formed, a very small amount of dopant material is added to the host material. Therefore, the deposition rate of the dopant material is needed to be controlled so as to be much smaller than the deposition rate of the host material, and precise control of the deposition rate is needed.

However, in the case where deposition is performed using a crucible, a temperature distribution in the crucible tends to be nonuniform and it is difficult to maintain a constant deposition rate. In particular, in the case where different kinds of materials such as a host material and a dopant material are co-evaporated, it is very difficult to precisely control the deposition rate of each of the host material and the dopant material.

In view of the foregoing problems, it is an object of the present invention to provide a formation method which is capable of easily forming a desired organic compound layer by use of a plurality of evaporation materials. In addition, it is another object to provide a formation method which is capable of precisely forming an organic compound layer in which a plurality of materials are mixed. Moreover, it is another object to provide a manufacturing method of a light-emitting device including an organic compound layer formed using the above-described method.

A first organic compound layer containing a plurality of evaporation materials each having a different evaporation temperature is formed over a first substrate. A second substrate is placed at a position facing the first substrate. The second substrate is placed so as to face the first organic compound layer provided over the first substrate. The first organic compound layer is heated as an evaporation source to be vaporized, whereby a desired second organic compound layer is formed over the second substrate placed so as to face the first substrate. Accordingly, a light-emitting device is manufactured.

The first organic compound layer is formed over the substrate, using a mixture which is formed in advance by mixture of a plurality of evaporation materials each having a different evaporation temperature. Note that the first organic compound layer is preferably formed by a wet method. In addition, as the plurality of evaporation materials each having a different evaporation temperature, for example, a host material and a dopant material which form a light-emitting layer of a light-emitting element are given. The plurality of evaporation materials contained in the first organic compound layer is vaporized by heating, whereby the second organic compound layer can be evaporated.

One aspect of the present invention, which is disclosed in this specification is a manufacturing method of a light-emitting device, which includes the steps of forming a first organic compound layer containing a plurality of evaporation materials each having a different evaporation temperature over a first substrate; placing a second substrate provided with a first electrode at a position facing the first substrate so that the first electrode and the first organic compound layer face each other; forming a second organic compound layer on the first electrode provided for the second substrate in such a manner that the first organic compound layer is heated to be vaporized; and forming a second electrode on the second organic compound layer.

Another aspect of the present invention, which is disclosed in this specification is a manufacturing method of a light-emitting device, which includes the steps of forming a first organic compound layer containing a host material and a dopant material, the evaporation temperature of which is higher than that of the host material, over a first substrate; placing a second substrate provided with a first electrode at a position facing the first substrate so that the first electrode and the first organic compound layer face each other; forming a second organic compound layer over the first electrode provided for the second substrate in such a manner that the first organic compound layer is heated at a temperature higher than the evaporation temperature of the host material and lower than the evaporation temperature of the dopant material to be vaporized; and forming a second electrode over the second organic compound layer.

In the above-described structure, a material, the decomposition temperature of which is higher than the evaporation temperature of the host material can be used as the dopant material. Note that, in this specification, "evaporation temperature" means the temperature at which the material is sublimated. In addition, "decomposition temperature" means the temperature at which a change occurs by effect of heat in at least part of the chemical formula expressing the material.

In addition, in the above-described structure, the second organic compound layer formed on the second substrate contains the same material as the first organic compound layer. Therefore, it can be said that the formation of the second organic compound layer in the above-described structure is the transfer of the organic compound layer from the first substrate to the second substrate.

Note that, in this specification, the distance between a surface of the first organic compound layer formed over the first substrate, which serves as an evaporation source and a surface of the second substrate is indicated by distance d. In addition, in the case where any layer (e.g., a conductive layer which functions as an electrode or an insulating layer which functions as a partition wall) is formed over the second substrate, the distance d is defined as the distance between the surface of the organic compound layer over the first substrate and the surface of the layer formed over the second substrate. Note that, in the case where the second substrate or the layer formed over the second substrate is uneven, the distance d is defined as the shortest distance between the surface of the organic compound layer over the first substrate and the second substrate or an outermost surface of the layer formed over the second substrate.

The present invention makes it possible to easily form an organic compound layer in which a plurality of materials each having a different evaporation temperature is mixed. In addition, a desired organic compound layer can be obtained precisely without requiring complicated control. Moreover, a light-emitting device which includes the organic compound layer thus obtained can be provided.

BRIEF DESCRIPTION OF THE DRAWINGS

In the accompanying drawings:

FIG. 8A shows an example of a top view of an active matrix light-emitting device, and FIG. 8B shows an example of a cross-sectional view thereof;

FIGS. 11A to 11E are diagrams each showing an example of an electronic appliance;

DETAILED DESCRIPTION OF THE INVENTION

Figure 1A:
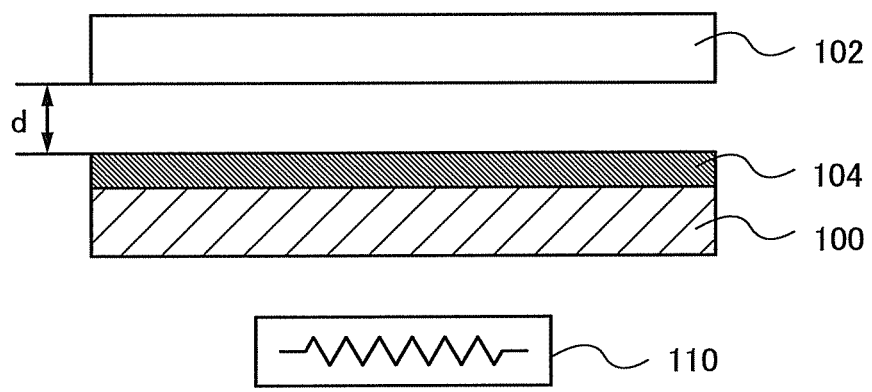
FIGS. 1A and 1B are schematic views each showing a cross section of a deposition process of the present invention.

Embodiment Modes of the present invention will be hereinafter described with reference to the accompanying drawings. Note that the present invention is not limited to the description below and it is easily understood by those skilled in the art that modes and details of the present invention can be modified in various ways without departing from the purpose and scope of the present invention. Therefore, the present invention should not be interpreted as being limited to the description below of Embodiment Modes. Note that, in some cases, in the structure of the present invention described below, reference numerals denoting the same portions may be used in common in different drawings.

Embodiment Mode 1

Figure 1B:
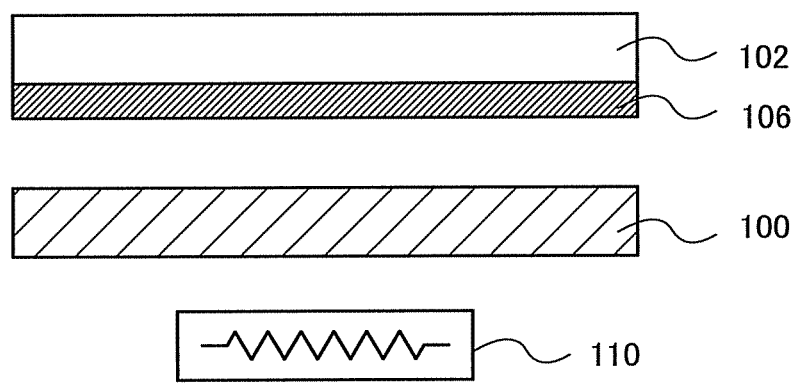
Figure 2:
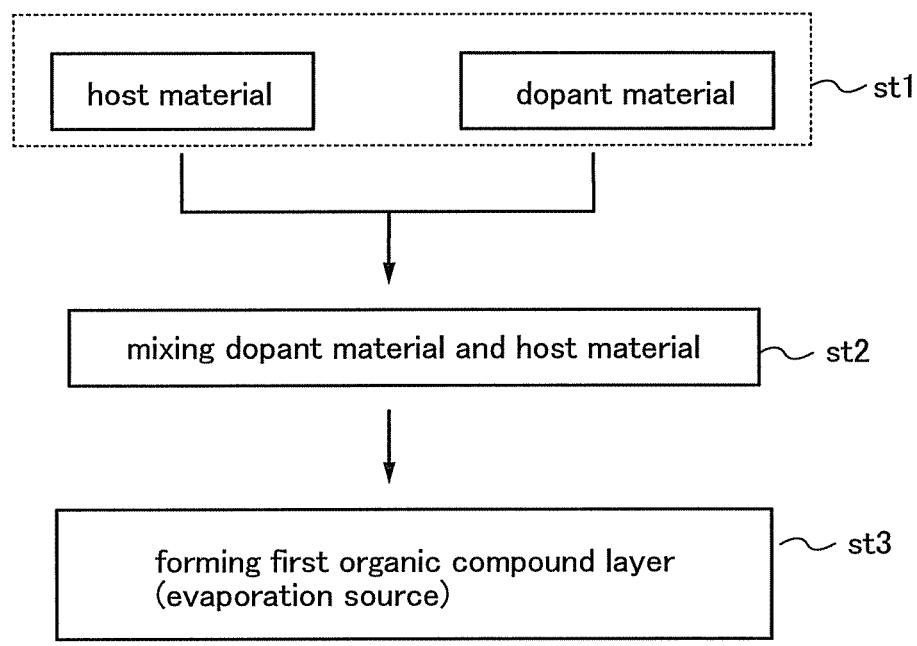
FIG. 2 is a flow chart showing an example of a formation process of an evaporation source of the present invention.
Figure 3:
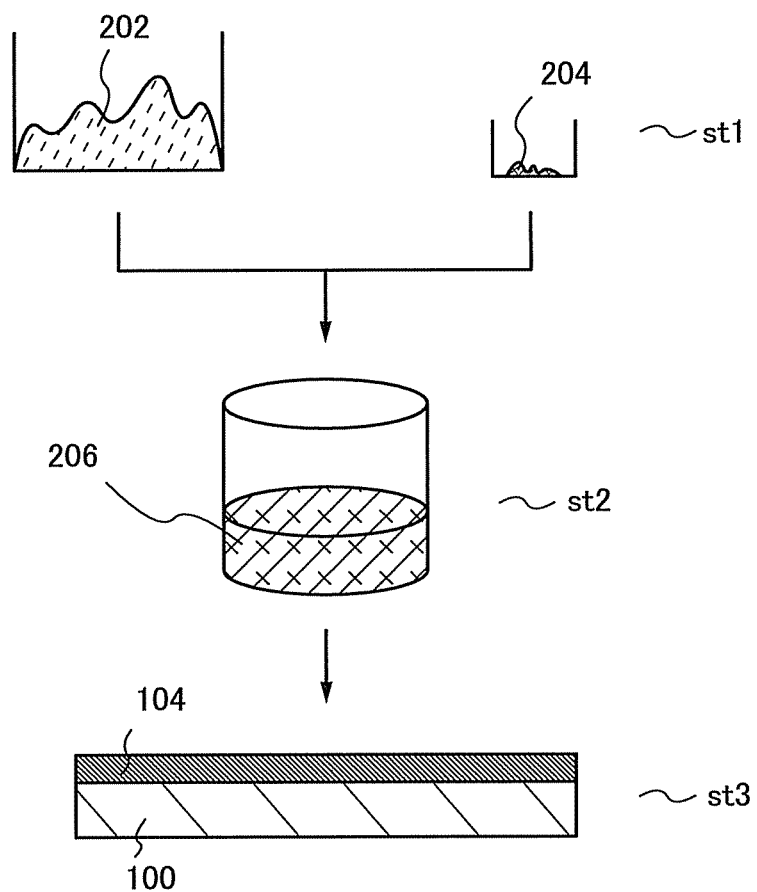
FIG. 3 is a flow chart showing an example of a formation process of an evaporation source of the present invention.

A manufacturing method of a light-emitting device of the present invention will be described with reference to FIGS. 1A and 1B, FIG. 2, and FIG. 3. FIGS. 1A and 1B are each a simple schematic view of a deposition apparatus. FIG. 2 and FIG. 3 are each a flow chart illustrating formation of an evaporation source of the present invention.

A first organic compound layer 104 is formed over a first substrate 100 (see FIG. 1A).

The first organic compound layer 104 is an evaporation source of the present invention. The first organic compound layer 104 contains at least two kinds of evaporation materials each having a different evaporation temperature. In this embodiment mode, the first organic compound layer 104 contains at least one host material and one dopant material each of which forms an organic compound layer (e.g., a light-emitting layer, a hole transporting layer, a hole injecting layer, an electron transporting layer, or an electron injecting layer) which is included in a light-emitting element.

The first substrate 100 is a substrate over which the first organic compound layer 104 which serves as an evaporation source is formed. The first substrate 100 serves as a supporting substrate of the first organic compound layer 104. As the first substrate 100, for example, the following can be used: an oxide substrate made of quartz, ceramic, sapphire, or the like, or a conductive substrate made of a metal material such as gold, platinum, copper, silver, tungsten, tantalum, titanium, or aluminum, or an alloy material of the metal. Alternatively, a substrate in which the above-described metal material or the above-described alloy material is formed over the oxide substrate, or the like can be used. Further alternatively, a conductive substrate over which a semiconductor material such as silicon or germanium is deposited can be used. Still alternatively, a substrate in which an amorphous silicon film or a microcrystalline silicon film is formed over a light-transmitting substrate (e.g., a glass substrate, a quartz substrate, or a plastic substrate containing an inorganic material) may be used.

A plurality of evaporation materials each having a different evaporation temperature (e.g., a host material and a dopant material) are mixed and the mixture is evaporated over the first substrate 100, whereby the first organic compound layer 104 is formed. In this embodiment mode, a formation method of the first organic compound layer 104 is described in detail with reference to FIG. 2 and FIG. 3.

First, desired evaporation materials are prepared. In this embodiment mode, as the desired evaporation materials, a host material 202 and a dopant material 204 each of which has a different evaporation temperature are prepared (Step (st) 1). Note that the weight ratio of the host material 202 and the dopant material 204 which are to be prepared is determined in accordance with the function and purpose of an organic compound layer which is to be formed by deposition. The weight ratio of the materials prepared in this step controls the component ratio of the organic compound layer which is to be formed by deposition. In the case where an organic compound layer which functions as a light-emitting layer is formed, a very small amount of dopant material is generally added to a host material. For example, a dopant material is added so as to be contained in the host material within a range of 0.5 to 10 wt %. In addition, in the case where a light-emitting layer is formed, a dopant material serves as a light-emitting material and a host material has a function of dispersing the dopant material.

In this embodiment mode, the plurality of evaporation materials each having a different evaporation temperature is used. It is one of the objects to deposit an organic compound layer at a heating temperature which is lower than the highest evaporation temperature of the evaporation temperatures of the plurality of evaporation materials. In order to achieve the object, it is desirable to prepare a material having a evaporation temperature which is lower than that of the dopant material 204 as the host material 202. In addition, as the host material 202, it is desirable to prepare a material having an evaporation temperature which is lower than the decomposition temperature of the dopant material 204. In other words, it is desirable that the evaporation temperature of the host material 202 which is to be prepared be lower than the evaporation temperature of the dopant material 204 and lower than the decomposition temperature of the dopant material 204.

As the evaporation materials, at least one kind of host material and one kind of dopant material are prepared. Therefore, two or more kinds of host materials and one kind of dopant material may be used, or two or more kinds of dopant materials and one kind of host material may be used. Alternatively, two or more kinds of host materials and two or more kinds of dopant materials may be used.

In the case where a light-emitting layer is formed, for example, the following can be given as the host material 202: 4,4'-di(N-carbazolyl)biphenyl (CBP), 2-tert-butyl-9,10-di(2-naphthyl)anthracene (t-BuDNA), 9-[4-(9-carbazolyl)phenyl]-10-phenylanthracene (CzPA), and the like in addition to 4,4'-bis[N-(1-napthyl)-N-phenylamino]biphenyl (NPB), tris (8-quinolinolato)aluminum(III) (Alq), 4,4'-bis[N-(9,9-dimethylfluoren-2-yl)-N-phenylamino]biphenyl (DFLDPBi), bis(2-methyl-8-quinolinolato)(4-phenylphenolato)aluminum(III) (BAlq), and the like.

As the dopant material 204, for example, a phosphorescent compound or a fluorescent compound can be used. Specifically, the following can be given as a phosphorescent compound: (acetylacetonato)bis(2,3,5-triphenylpyrazinato)iridium(III) (kr(tppr)$_2$(acac)), bis[2-(4',6'-difluorophenyl) pyridinato-N,C$^{2'}$]iridium(III)picolinate (FIrpic), tris(2-phenylpyridinato-N,C$^{2'}$)iridium(III) (Ir(ppy)$_3$), bis(2-phenylpyridinato-N,C$^{2'}$)iridium(acetylacetonate) (Ir(ppy)$_2$ (acac)), bis(2-phenylbenzothiazolato-N,C$^{2'}$)iridium(III) acetylacetonate (Ir(bt)$_2$(acac)), tris(2-phenylquinolinato-N, C$^{2'}$)iridium(III) (Ir(pq)$_3$), bis(2-phenylquinolinato-N,C$^{2'}$) iridium(III)acetylacetonate (Ir(pq)$_2$(acac)), bis[2-(2'-benzo [4,5-α]thienyl)pyridinato-N,C$^{3'}$]iridium(III)acetylacetonate (Ir(btp)$_2$(acac)), bis(1-phenylisoquinolinato-N,C$^{2'}$)iridium (III)acetylacetonate (Ir(piq)$_2$(acac)), (acetylacetonato)bis[2, 3-bis(4-fluorophenyl)quinoxalinato]iridium(III) (Ir(Fdpq)$_2$ (acac)), 2,3,7,8,12,13,17,18-octaethyl-21H,23H-porphyrinplatinum(III) (PtOEP), and the like. Specifically, the following can be given as a fluorescent compound: perylene, 2,5,8,11-tetra(tert-butyl)perylene (TBP), 4,4'-bis [2-(N-ethylcarbazol-3-yl)vinyl]biphenyl (BCzVBi), 5,12-diphenyltetracene, N,N-dimethylquinacridone (DMQd), N,N'-diphenylquinacridone (DPQd), 4-dicyanomethylene-2-isopropyl-6-[2-(1,1,7,7-tetramethyljulolidin-9-yl)ethenyl]-4H-pyran (DCJTI), rubrene, coumarin 6, coumarin 30, and the like. In addition to the above-described examples, 9-(4-{N-[4-(carbazol-9-yl)phenyl]-N-phenylamino}phenyl)-10-phenylanthracene (YGAPA) and the like can be given.

Next, the host material 202 and the dopant material 204 are mixed to form a mixture 206 of the host material 202 and the dopant material 204 (hereinafter, referred to as "host-dopant mixture") (st 2). The host material 202 and the dopant material 204 are mixed using a solvent as appropriate. Any solvent can be used without particular limitations as long as the solvent can sufficiently dissolve or disperse the host material 202 and the dopant material 204, and also is not reacted with both the materials. For example, as a solvent, any of the following can be used: halogen solvents such as chloroform, tetrachloromethane, dichloromethane, 1,2-dichloroethane, and chlorobenzene; ketone solvents such as acetone, methyl ethyl ketone, diethyl ketone, n-propyl methyl ketone, and cyclohexanone; aromatic solvents such as benzene, toluene, or xylene; ester solvents such as ethyl acetate, n-propyl acetate, n-butyl acetate, ethyl propionate, γ-butyrolactone, and diethyl carbonate; ether solvents such as tetrahydrofuran and dioxane; amide solvents such as dimethylformamide and dimethylacetamide; dimethyl sulfoxide; hexane; water; and the like.

Next, the host-dopant mixture 206 is applied over the first substrate 100 by a wet process. Accordingly, the first organic compound layer 104 is formed (st 3). The first organic compound layer 104 is a mixed layer in which the dopant material 204 is dispersed in the host material 202.

A method of applying the host-dopant mixture over the substrate is not particularly limited as long as the method is a wet method. For example, a spin coating method, an ink jet method, a dip coating method, a cast method, a dye coating method, a roll coating method, a blade coating method, a bar coating method, a gravure coating method, a printing method, or the like can be used. Through the above-described steps, the first organic compound layer 104 which serves as an evaporation source can be obtained. As described above, the desired evaporation materials are mixed and dissolved or dispersed in the solvent, whereby the evaporation source can be easily formed by a wet method. In addition, the plurality of evaporation materials each having a different evaporation temperature is mixed in advance in the evaporation source of the present invention. Therefore, the number of evaporation source is one, unlike the case where co-evaporation is employed.

Note that after the host-dopant mixture 206 is applied over the substrate, vacuum baking may be performed in the temperature range which does not change the formed first organic compound layer 104. In addition, as the host-dopant mixture 206, a polymer which functions as a binder (also referred to as a polymer binder) may be mixed in addition to the host material 202 and the dopant material 204. There are no particular limitations on the type of binder as long as the binder is not reacted with the host material 202 and the dopant material 204. For example, the following can be used: poly vinyl chloride, polycarbonate, polystyrene, polymethyl methacrylate, polybutyl methacrylate, polyester, polysulfone, polyphenylene oxide, polybutadiene, a hydrocarbon resin, a ketone resin, a phenoxy resin, polyamide, ethyl cellulose, vinyl acetate, an ABS resin, polyurethane, a melamine resin, unsaturated polyester, an alkyd resin, an epoxy resin, a silicone resin, polyvinyl butyral, polyvinyl acetal, or the like.

Next, the first substrate 100 is carried in a deposition chamber. Then, a second substrate 102 is placed so as to face a surface of the first substrate 100, which is provided with the first organic compound layer 104. In this embodiment mode, the first organic compound layer and one surface of the second substrate 102 are made to face each other. The second substrate 102 is a substrate on which a film is to be formed (hereinafter, referred to as a deposition substrate), on which a desired layer is deposited through a deposition process. Then, the first substrate 100 and the second substrate 102 in the deposition chamber are brought close to each other so as to face at close range therebetween, specifically, they are brought close to each other so that the distance d between the first organic compound layer 104 provided over the first substrate 100 and the second substrate 102 becomes greater than or equal to 0 mm and less than or equal to 50 mm, preferably greater than or equal to 0 mm and less than or equal to 10 mm (see FIG. 1A).

The distance d is defined as the distance between a surface of the first organic compound layer formed over the first substrate 100 and the surface of the second substrate. In addition, in the case where any layer (e.g., a conductive layer which functions as an electrode or an insulating layer which functions as a partition wall) is formed on the second substrate, the distance d is defined as the distance between the surface of the organic compound layer over the first substrate and the surface of the layer formed on the second substrate. Note that, in the case where the second substrate or the layer formed on the second substrate is uneven, the distance d is defined as the shortest distance between the surface of the organic compound layer over the first substrate and the second substrate or an outermost surface of the layer formed on the second substrate.

Although, in this embodiment mode, it is desirable that the distance between the first substrate and the second substrate be short in order to increase use efficiency of the material, the present invention is not limited to this structure. If use efficiency of the material is not considered, the distance d between the first substrate and the second substrate may be greater than or equal to 50 mm.

The deposition chamber is preferably vacuum-evacuated. Specifically, the deposition chamber is vacuum-evacuated to less than or equal to $5 \times 10^{-3}$ Torr (0.665 Pa), preferably the range from about $10^{-4}$ to about $10^{-6}$ Torr. As a vacuum evacuation unit, an oil-free dry pump is used when vacuum evacuation of from the atmospheric pressure to a pressure on the order of 1 Pa is performed, whereas a magnetic floating turbo molecular pump or a compound molecular pump is used when vacuum evacuation of a pressure lower than the above-described range is performed. A cryo-pump may also be provided in the deposition chamber in order to remove moisture. This prevents contamination by an organic matter from the evacuation unit, such as mainly oil. Mirror treatment is performed on an inner wall surface by electrolytic polishing to reduce the surface area, and accordingly gas is prevented from discharging.

In addition, a heating unit is provided in the deposition chamber. The first substrate 100 is placed near the heating unit. FIGS. 1A and 1B each show an example in which a heater 110 is provided as the heating unit. Note that there are no particular limitations on the type of heating unit as long as the heating unit can perform uniform heating in a short time. For example, a lamp may be used, or a resistance heating method may be used. In addition, a conductive substrate may be used as the first substrate 100 and current may be passed through the conductive substrate, whereby heating can be performed. In this case, the first substrate 100 is a supporting substrate and also has a function as a heating unit.

Next, the first organic compound layer 104 provided over the first substrate 100 is heated to be vaporized, whereby a second organic compound layer 106 is evaporated on a surface on which a film is to be deposited (hereinafter, referred to as a deposition surface) (a lower surface in FIGS. 1A and 1B) of the second substrate 102, which is placed so as to face the first substrate 100 (see FIG. 1B).

Through the above-described steps, the second organic compound layer 106 can be formed on one surface of the second substrate 102, specifically the substrate surface which faces the first substrate 100. Note that the thickness of the second organic compound layer 106 which is to be deposited depends on the thickness of the first organic compound layer 104 which serves as the evaporation source. At this time, depending on a material of the first organic compound layer 104, the thicknesses of the second organic compound layer 106 and the first organic compound layer 104 can be made to be approximately the same. In other words, the evaporation source can control the thickness of the layer which is to be formed by a deposition process.

In this embodiment mode, the deposition process is performed using the organic compound layer which serves as an evaporation source and is formed over the substrate by application by a wet method. In other words, the evaporation source has approximately the same area as the deposition substrate. This makes it possible to uniformly heat the whole evaporation source in a shorter time than in the case where a conventional crucible or a conventional deposition boat is used. Thus, the organic compound layer can be precisely evaporated on the second substrate which is a deposition substrate. Furthermore, the distance d between the first substrate over which the evaporation source is formed and the second substrate which is a deposition substrate is shortened, whereby the evaporation materials can be prevented from being dispersed in portions other than the second substrate (e.g., the inner wall of the deposition chamber). Thus, the organic compound layer can be evaporated on the deposition substrate without wasting the evaporation materials.

The first organic compound layer 104 contains the plurality of evaporation materials (in this embodiment mode, the host material and the dopant material) each having a different evaporation temperature. The heating by which the first organic compound layer 104 is vaporized to deposit the second organic compound layer 106 is performed at a heating temperature which is lower than the highest evaporation temperature of the evaporation temperatures of the evaporation materials contained in the first organic compound layer 104.

For example, in this embodiment mode, the host material and the dopant material are contained in the first organic compound layer 104, and the dopant material has higher evaporation temperature than the host material. In this case, the first organic compound layer 104 is heated at a heating temperature lower than the evaporation temperature of the dopant material. The first organic compound layer 104 is preferably heated at a temperature which is approximately the same as the evaporation temperature of the host material. The first organic compound layer 104 is more preferably heated at a heating temperature which is lower than the decomposition temperature of the dopant material. In other words, the first organic compound layer 104 is heated at a heating temperature which is lower than the evaporation temperature of the dopant material, preferably lower than the decomposition temperature of the dopant material.

As described above, the first organic compound layer 104 is heated to be vaporized, whereby the second organic compound layer 106 can be deposited. In this embodiment mode, the first organic compound layer 104 is heated at a temperature lower than the evaporation temperature of the dopant material contained in the first organic compound layer 104, whereby the second organic compound layer 106 can be evaporated over the second substrate 102 which is a deposition substrate. The reason why the heating temperature for forming the first organic compound layer 104 can be lower than the evaporation temperature of the dopant material as described above is considered that a dopant material dispersed in a host material can be vaporized together with the host material when the host material is vaporized, by addition of a very small amount of dopant material to the host material. Note that using the host material having the evaporation temperature which is lower than the decomposition temperature of the dopant material makes it possible to deposit the second organic compound layer 106 without decomposing the evaporation materials. In this manner, the heating temperature at the time of the deposition can be lowered depending on the evaporation materials to be selected. Thus, the present invention is very useful in depositing a material, the temperature of which is difficult to control when it is by itself, for example, a material, the evaporation temperature and the decomposition temperature of which are very close. In particular, in the case where a light-emitting layer is formed using a dopant material as a light-emitting material, decomposition of the light-emitting material can be prevented; thus, desired light emission can be obtained. Using the light-emitting layer which is formed as described above makes it possible to manufacture a light-emitting device which displays clear images.

Note that, in the case where a polymer which functions as a binder is mixed in the first organic compound layer 104, the host material and the dopant material are selectively vaporized, whereby the second organic compound layer 106 can be evaporated.

The heating of the first organic compound layer 104 is performed using the heating unit provided in the deposition chamber. For example, in the case where the heater 110 is provided as shown in FIGS. 1A and 1B, the heater 110 may be kept away from the first substrate 100 before the heating (deposition) and the heater 110 may be brought close to the first substrate 100 at the time of the heating. Alternatively, a switch which works with the heater 110 may be provided so that the heating and heat insulating may be controlled by turning on and off of the switch. In the case where a lamp is used as the heating unit, heating and heat insulating can be controlled by lighting and extinction of the lamp. Further alternatively, an openable and closable shutter may be provided between the heating unit and the first substrate 100 so that heating and heat insulating are controlled.

In addition, in the case where a lamp is used as the heating unit, part of the inner wall of the deposition chamber may be made of a light-transmitting member and the lamp may be provided outside the deposition chamber. The lamp is placed outside the deposition chamber, whereby maintenance such as replacement of light bulbs of the lamp can be easier.

Figure 14A:
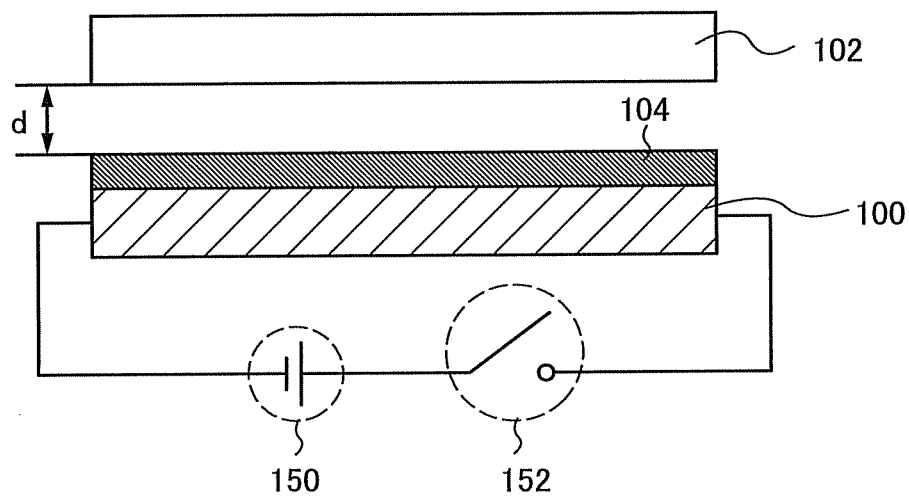
FIGS. 14A and 14B are schematic views each showing a cross section of a deposition process of the present invention.
Figure 14B:
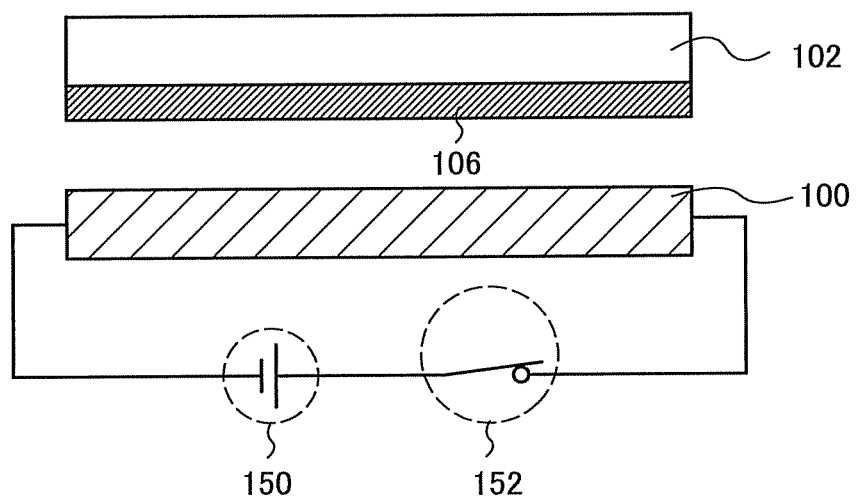

Alternatively, heating can also be performed in such a manner that a conductive substrate is used as the first substrate 100 and current is passed through the conductive substrate. For example, as shown in FIG. 14A, a power supply 150 and a switch 152 which are electrically connected to the first substrate 100 which is a conductive substrate are provided. When the switch 152 is turned on as shown in FIG. 14B, current is passed through the first substrate 100, whereby heating can be performed. The first organic compound layer 104 is heated to be vaporized by current passed through the first substrate 100, whereby the second organic compound layer 106 can be formed on the second substrate 102. Note that, in this case, the first substrate 100 has a function as part of a heating unit.

Note that, although FIGS. 1A and 1B each show an example in which the size of the first substrate 100 and the size of the second substrate 102 are the same, there are no particular limitations on the sizes of the first substrate 100 and the second substrate 102, and the size of one of the substrates may be larger than that of the other.

In addition, in the case where deposition is selectively performed on the deposition substrate, a mask including an opening may be placed between the first substrate and the second substrate.

In a deposition method which is applied to the light-emitting device of the present invention, the evaporation source is used which contains the host material and the dopant material as the plurality of evaporation materials each having a different evaporation temperature, which have been mixed at the desired weight ratio. The evaporation materials contained in the evaporation source can be vaporized uniformly, whereby the organic compound layer containing the same evaporation materials as the evaporation source at approximately the same weight ratio as the evaporation source can be evaporated on the deposition substrate. As described above, in the deposition method of the present invention, in the case where deposition is performed using the plurality of evaporation materials each having a different evaporation temperature, the deposition rate of each evaporation material is not needed to control, unlike the case of co-evaporation. Thus, complicated control of the deposition rate or the like is not needed to perform, and the desired organic compound layer can be deposited easily and precisely.

In addition, in the deposition method which is applied to the light-emitting device of the present invention, the thickness of organic compound layer to be evaporated on the deposition substrate by deposition treatment can be controlled by the thickness of the evaporation source formed over the supporting substrate. In other words, the evaporation source formed over the supporting substrate may be evaporated as it is; thus, a film-thickness monitor is not needed. Therefore, a user does not have to adjust the deposition speed by use of the film-thickness monitor, and the deposition process can be fully automated. Accordingly, throughput can be increased.

Moreover, by the deposition method of the present invention, desired evaporation materials can be deposited, without being wasted, on the deposition substrate. Thus, use efficiency of the evaporation materials is increased, and costs can be reduced. In addition, the evaporation materials can be prevented from being attached to the inner wall of the deposition chamber, and maintenance of the deposition apparatus can be easier.

Accordingly, application of the present invention makes it possible to easily deposit a desired organic compound layer and to increase throughput in manufacture of a light-emitting device using the organic compound layer, or the like.

Note that, although the substrate over which the evaporation materials are formed is used as the evaporation source in this embodiment mode, the present invention is not limited thereto. In other words, the evaporation source is not necessarily an evaporation source using a substrate having approximately the same area as a deposition substrate. In the case where uniformity of the thickness after deposition is not so important, for example, a plurality of evaporation materials each having a different an evaporation temperature which has been mixed may be put in a crucible, a deposition boat, or the like to be used as an evaporation source. In addition, when the evaporation materials are put in a crucible or a deposition boat, a solvent, a binder, or the like may be added thereto as appropriate.

Note that this embodiment mode can be combined with other embodiment modes described in this specification as appropriate.

Embodiment Mode 2

In this embodiment mode, a manufacturing method of a light-emitting device, to which the present invention is applied, will be described.

Figure 4A:
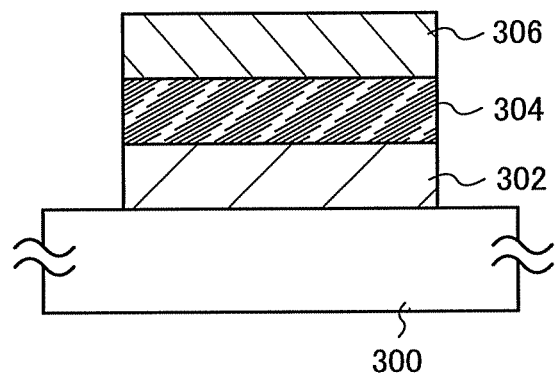
FIGS. 4A and 4B are views each showing an example of a light-emitting element.
Figure 4B:
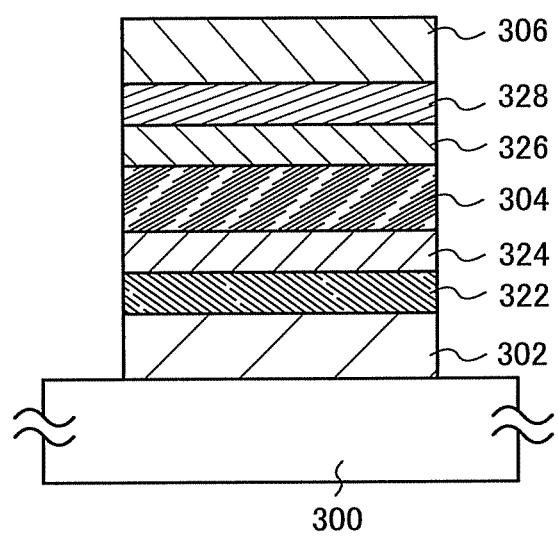

For example, light-emitting elements shown in FIGS. 4A and 4B can be manufactured. In the light-emitting element shown in FIG. 4A, a first electrode layer 302, an organic compound layer which functions as a light-emitting layer 304, and a second electrode layer 306 are stacked in this order over a substrate 300. One of the first electrode layer 302 and the second electrode layer 306 functions as an anode, and the other functions as a cathode. Holes injected from the anode and electrons injected from the cathode are recombined in the light-emitting layer 304, whereby light emission can be obtained. In this embodiment mode, the light-emitting layer 304 is formed of the organic compound layer in which a very small amount of dopant material which is a light-emitting material is dispersed in a host material. In addition, the first electrode layer 302 functions as an anode and the second electrode layer 306 functions as a cathode.

In the light-emitting element shown in FIG. 4B, a hole injecting layer, a hole transporting layer, an electron transporting layer, and an electron injecting layer are provided, in addition to the components in the above-described structure shown in FIG. 4A, are provided. The hole transporting layer is provided between the anode and the light-emitting layer. In addition, the hole injecting layer is provided between the anode and the light-emitting layer, or between the anode and the hole transporting layer. On the other hand, the electron transporting layer is provided between the cathode and the light-emitting layer, and the electron injecting layer is provided between the cathode and the light-emitting layer, or between the cathode and the electron transporting layer. Note that all of the hole injecting layer, the hole transporting layer, the electron transporting layer, and the electron injecting layer are not necessarily provided, and the layer which is to be provided may be selected as appropriate in accordance with the desired function or the like. In FIG. 4B, the first electrode layer 302 which functions as an anode, a hole injecting layer 322, a hole transporting layer 324, the light-emitting layer 304, an electron transporting layer 326, an electron injecting layer 328, and the second electrode layer 306 which functions as a cathode are stacked in this order over the substrate 300.

The light-emitting layer 304, the hole injecting layer 322, the hole transporting layer 324, the electron transporting layer 326, and/or the electron injecting layer 328 can be formed by application of the deposition method described in Embodiment Mode 1.

For example, in the case where the light-emitting element shown in FIG. 4A is formed, a first organic compound layer which serves as an evaporation source for forming a light-emitting layer is formed over a supporting substrate, and the supporting substrate is placed so as to face a deposition substrate. The first organic compound layer formed over the supporting substrate is heated to be vaporized, whereby the light-emitting layer 304 is formed on the deposition substrate. Then, the second electrode layer 306 is formed over the light-emitting layer 304. In this embodiment mode, the deposition substrate is the substrate 300. Note that the first electrode layer 302 is formed in advance on the deposition substrate. Thus, the first organic compound layer formed over the supporting substrate and the first electrode layer 302 formed on the substrate 300 are made to face each other. The first organic compound layer which serves as the evaporation source for forming the light-emitting layer is a mixed layer in which a very small amount of dopant material (light-emitting material) is dispersed in a host material. As the host material for forming the first organic compound layer, a material, the evaporation temperature of which is lower than that of the dopant material, is used. In this embodiment mode, the first organic compound layer is heated at a temperature which is lower than the evaporation temperature of the contained dopant material to be vaporized, whereby the light-emitting layer 304 can be formed on the deposition substrate. In addition, if a host material, the evaporation temperature of which is lower than the decomposition temperature of the dopant material, is used, the light-emitting layer 304 can be formed on the deposition substrate, without decomposing evaporation materials contained in the first organic compound layer. The light-emitting layer 304 contains the same material as the first organic compound layer, in which the dopant material is dispersed in the host material.

In addition, in the case where the light-emitting element shown in FIG. 4B, in which the layers with a variety of functions are stacked, is formed, a procedure may be repeated in which a first organic compound layer is formed over a supporting substrate, the supporting substrate is placed so as to face a deposition substrate, the first organic compound layer formed over the supporting substrate is heated to be vaporized, whereby a second organic compound layer is formed on the deposition substrate. For example, an organic compound layer which serves as an evaporation source for forming the hole injecting layer is formed over the supporting substrate, and the supporting substrate is placed so as to face the deposition substrate, and then the organic compound layer formed over the supporting substrate is heated to be vaporized, whereby the hole injecting layer 322 is formed on the deposition substrate. In this embodiment mode, the deposition substrate is the substrate 300, which is provided with the first electrode layer 302 in advance. Subsequently, an organic compound layer which serves as an evaporation source for forming the hole transporting layer is formed over a supporting substrate, and the supporting substrate is placed so as to face the deposition substrate, and then the organic compound layer formed over the supporting substrate is heated to be vaporized, whereby the hole transporting layer 324 is formed on the hole injecting layer 322 on the deposition substrate.

After that, the light-emitting layer 304, the electron transporting layer 326, and the electron injecting layer 328 are stacked in this order in a similar manner, and then the second electrode layer 306 is formed.

Each of the hole injecting layer 322, the hole transporting layer 324, the electron transporting layer 326, and the electron injecting layer 328 may be formed using a known EL material. A material used for forming each layer may be one type of material or a composite material of plural kinds of materials. In the case where each layer is formed using a composite material, a first organic compound layer which serves as an evaporation source may be formed in such a manner that materials are mixed in advance as described in Embodiment Mode 1. Also in the case where each layer is formed using one type of material, a first organic compound layer may be formed by application of the deposition method described in Embodiment Mode 1. Specifically, a first organic compound layer which serves as an evaporation source may be formed in such a manner that a material in which a desired material is dissolved or dispersed in a solvent is applied by a wet method. In addition, each of the hole injecting layer 322, the hole transporting layer 324, the electron transporting layer 326, and the electron injecting layer 328 may have a single-layer structure or a stacked-layer structure. For example, the hole transporting layer 324 may have a stacked-layer structure in which a first hole transporting layer and a second hole transporting layer are stacked.

As the substrate 300, a substrate with an insulating surface or an insulating substrate is used. Specifically, any of a variety of glass substrates made of glass used for the electronics industry, such as alminosilicate glass, aluminoborosilicate glass, or barium borosilicate glass; a quartz substrate; a ceramic substrate; a sapphire substrate; or the like can be used.

The first electrode layer 302 or the second electrode layer 306 can be formed of a single-layer film or a stacked-layer film using gold (Au), platinum (Pt), nickel (Ni), tungsten (W), chromium (Cr), molybdenum (Mo), iron (Fe), cobalt (Co), copper (Cu), palladium (Pd), titanium nitride, calcium nitride, or the like, as well as an oxide conductive material such as indium tin oxide (ITO), indium tin oxide containing silicon oxide (ITSO), or indium zinc oxide (IZO) deposited by a sputtering method using a target in which 2 to 20 wt % of zinc oxide is mixed with indium oxide. Alternatively, aluminum, an alloy of magnesium and silver, an alloy of aluminum and lithium, or the like can be used. Note that since light emitted from the light-emitting layer 304 is extracted outside, one or both of the first electrode layer 302 and the second electrode layer 306 is/are formed so as to transmit light. For example, the first electrode layer 302 or the second electrode layer 306 is formed using a conductive material having a light-transmitting property, such as indium tin oxide, or silver, aluminum, or the like is formed to a thickness of several nm to several tens nm. Alternatively, the first electrode layer 302 or the second electrode layer 306 can have a stacked-layer structure including a thin film of a metal such as silver or aluminum and a thin film of a conductive material having a light-transmitting property, such as ITO. Note that the first electrode layer 302 or the second electrode layer 306 may be formed by a known method.

Through the above-described steps, the light-emitting element can be manufactured. As for the light-emitting element of this embodiment mode, the layers with a variety of functions, including the light-emitting layer, can be formed easily by application of the present invention. A light-emitting device can be manufactured by application of such a light-emitting element. For example, an example of a passive matrix light-emitting device manufactured by application of the present invention is described with reference to FIGS. 5A to 5C, FIG. 6, and FIG. 7.

In a passive matrix (also referred to as simple matrix) light-emitting device, a plurality of anodes arranged in stripes and a plurality of cathodes arranged in stripes are provided so as to intersect at right angles, and a light-emitting layer is interposed at each intersecting point of the anode and the cathode. Thus, a pixel at an intersection of an anode which is selected (to which voltage is applied) and a cathode which is selected emits light.

Figure 5A:
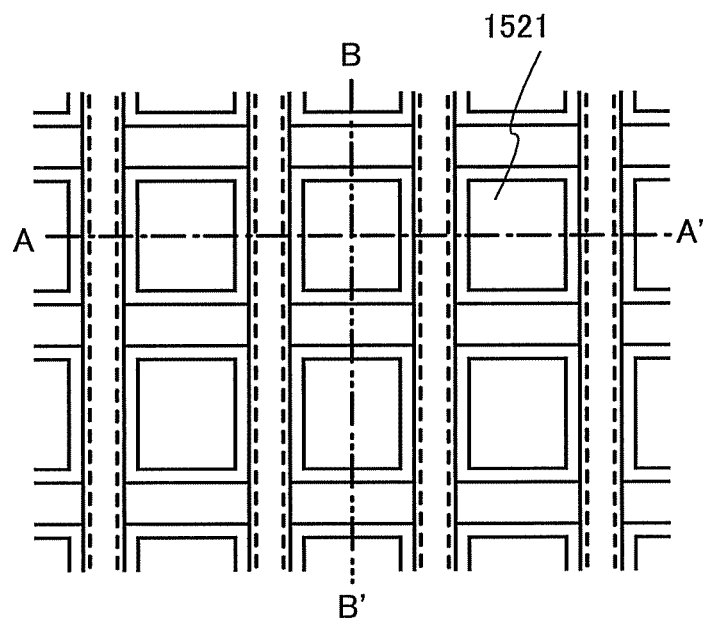
FIG. 5A shows an example of a top view of a passive matrix light-emitting device.
Figure 5B:
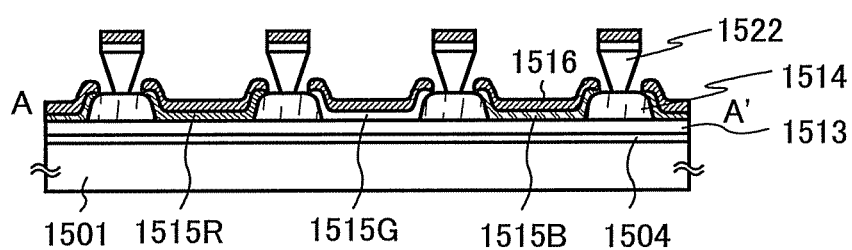
FIGS. 5B and 5C are examples of cross-sectional views thereof.
Figure 5C:
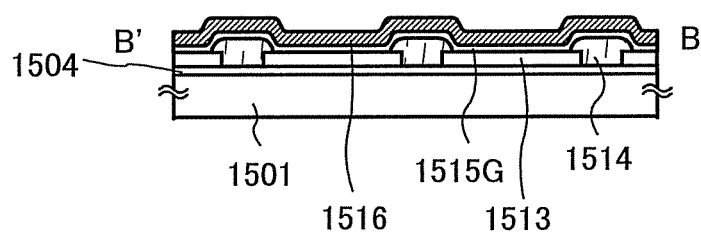

FIG. 5A is a top view of a pixel portion before sealing. FIG. 5B is a cross-sectional view taken along a dashed line A-A' in FIG. 5A. FIG. 5C is a cross-sectional view taken along a dashed line B-B' in FIG. 5A.

An insulating layer 1504 is formed as a base insulating layer over a first substrate 1501. Note that the insulating layer 1504 is not necessarily formed if the base insulating layer is not needed. A plurality of first electrode layers 1513 is arranged in stripes at regular intervals over the insulating layer 1504. A partition wall 1514 having openings corresponding to pixels is provided over the first electrode layers 1513. The partition wall 1514 having openings is formed using an insulating material (a photosensitive or nonphotosensitive organic material (e.g., polyimide, acrylic, polyamide, polyimide amide, a resist, or benzocyclobutene) or an SOG film (e.g., a $SiO_x$ film including an alkyl group)). Note that each opening corresponding to a pixel is a light-emitting region 1521.

A plurality of inversely-tapered partition walls 1522 parallel to each other is provided over the partition wall 1514 having openings to intersect with the first electrode layers 1513. The inversely-tapered partition walls 1522 are formed by a photolithography method using a positive-type photosensitive resin, portion of which unexposed to light remains as a pattern, and by adjustment of the amount of light exposure or the length of development time so that a lower portion of a pattern is etched more.

Figure 6:
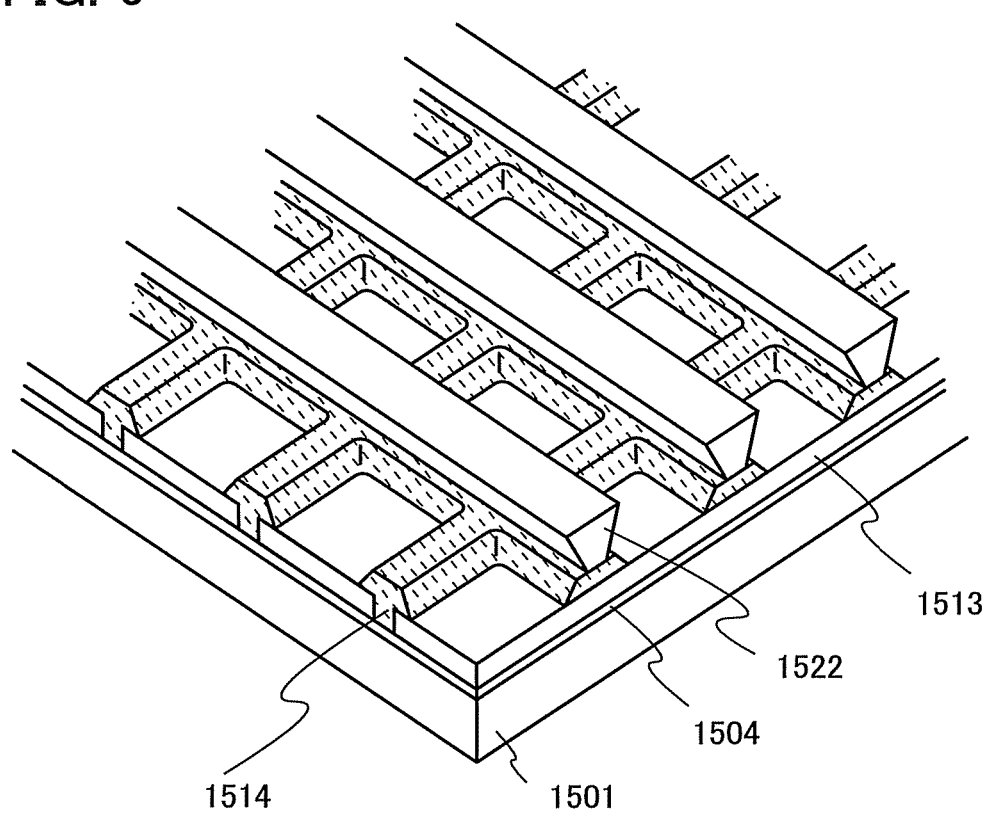
FIG. 6 shows an example of a perspective view of a passive matrix light-emitting device.

FIG. 6 shows a perspective view immediately after formation of the plurality of inversely-tapered partition walls 1522 parallel to each other. Note that the same reference numerals are used to denote the same portions as those in FIGS. 5A to 5C.

The total thickness of the partition wall 1514 having openings and the inversely-tapered partition wall 1522 is set to be larger than the total thickness of an EL layer including a light-emitting layer and a conductive layer which serves as a second electrode layer. When the conductive layer and the EL layer including a light-emitting layer are stacked over the first substrate having the structure shown in FIG. 6, the stacked layer is separated into a plurality of regions, which are stacked layers of a second electrode layer 1516 and an EL layer 1515R including a light-emitting layer; the second electrode layer 1516 and an EL layer 1515G including a light-emitting layer; and the second electrode layer 1516 and an EL layer 1515B including a light-emitting layer, as shown in FIGS. 5A to 5C. Note that the plurality of separated regions is electrically isolated from one another. The second electrode layers 1516 are electrodes in stripes, which are parallel to one another and extend along a direction intersecting with the first electrode layers 1513. Note that, although stacked layers each including the conductive layer and the EL layer including a light-emitting layer are also formed over the inversely-tapered partition walls 1522, they are separated from the stacked layers of the second electrode layer 1516 and the EL layer 1515R including a light-emitting layer; the second electrode layer 1516 and the EL layer 1515G including a light-emitting layer; and the second electrode layer 1516 and the EL layer 1515B including a light-emitting layer. Note that, in this embodiment mode, the EL layer refers to a layer including at least a light-emitting layer and may include a hole injecting layer, a hole transporting layer, an electron transporting layer, an electron injecting layer, and/or the like in addition to the light-emitting layer.

This embodiment mode describes an example of forming a light-emitting device, which provides three kinds of light emissions (R, G, and B) and is capable of performing full color display, by selective formation of the EL layers 1515R, 1515G, and 1515B each including a light-emitting layer. The EL layers 1515R, 1515G, and 1515B each including a light-emitting layer are formed into a stripe pattern parallel to one another. The deposition method described in Embodiment Mode 1 may be used for forming these EL layers. For example, a first supporting substrate over which an evaporation source of a light-emitting layer from which red emission is obtained is formed, a second supporting substrate over which an evaporation source of a light-emitting layer from which green emission is obtained is formed, and a third supporting substrate over which an evaporation source of a light-emitting layer from which blue emission is obtained is formed are prepared. In addition, a substrate provided with the first electrode layers 1513 is prepared as a deposition substrate. Then, the first supporting substrate, the second supporting substrate, or the third supporting substrate is placed so as to face the deposition substrate as appropriate, the evaporation source formed over the supporting substrate is heated to be vaporized, whereby the EL layer including the light-emitting layer is formed over the deposition substrate. Note that a mask or the like is used as appropriate in order to selectively form the EL layer at a desired position.

Alternatively, EL layers each including a light-emitting layer which emits light of the same emission color may be formed over an entire surface to provide a monochromatic light-emitting elements, whereby a light-emitting device which is capable of performing monochromatic display or a light-emitting device which is capable of performing area color display may be provided. Further alternatively, a light-emitting device which is capable of performing full color display may be provided by combination of a light-emitting device which provides white light emission and color filters.

In addition, if necessary, sealing is performed using a sealing material such as a sealing can or a glass substrate for sealing. For example, a glass substrate is used as a second substrate, and a first substrate and the second substrate are attached to each other using an adhesive material such as a sealant, whereby a space surrounded by the adhesive material such as a sealant is sealed off. The sealed space is filled with filler or a dry inert gas. In addition, a desiccant or the like may be put between the first substrate and the sealing material so that reliability of the light-emitting device is increased. A small amount of moisture is removed by the desiccant, whereby sufficient drying is performed. As the desiccant, a substance which adsorbs moisture by chemical adsorption, such as an oxide of an alkaline earth metal such as calcium oxide or barium oxide, can be used. Alternatively, a substance which adsorbs moisture by physical adsorption, such as zeolite or silica gel, can be used as another desiccant.

Note that a desiccant is not necessarily provided in the case where a sealing material which is in contact with the light-emitting element to cover the light-emitting element is provided and the light-emitting is sufficiently blocked from outside air.

Figure 7:
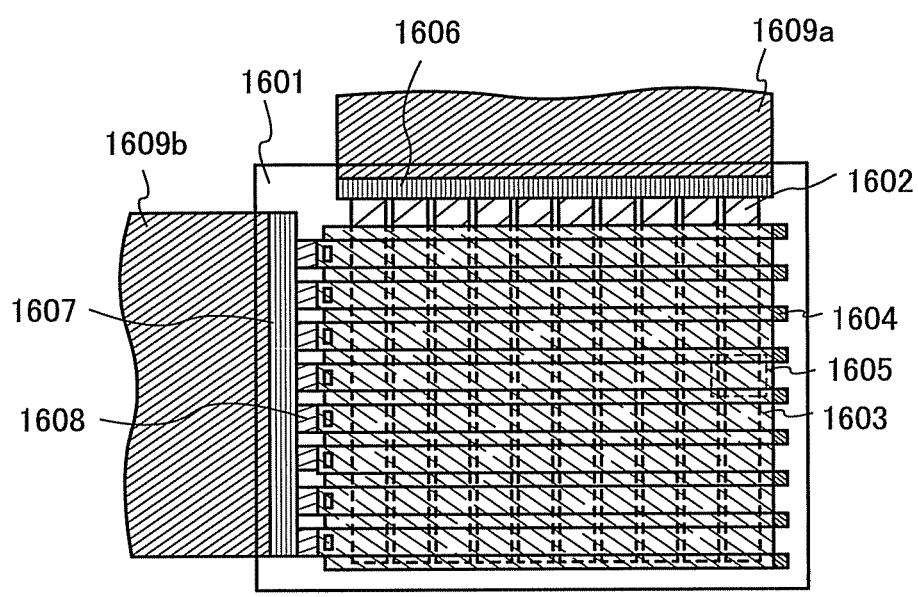
FIG. 7 shows an example of a top view of a passive matrix light-emitting device.

FIG. 7 is a top view of a light-emitting module mounted with an FPC or the like.

Note that the light-emitting device in this specification refers to an image display device, a light-emitting device, or a light source (including a lighting system). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a light-emitting element by a COG (chip on glass) method.

In a pixel portion for displaying images, scan lines and data lines intersect with each other so as to cross at right angles, as shown in FIG. 7.

The first electrode layers 1513 in FIGS. 5A to 5C correspond to scan lines 1603 in FIG. 7, the second electrode layers 1516 correspond to data lines 1602, and the inversely-tapered partition walls 1522 correspond to partition walls 1604. Light-emitting layers are interposed between the data lines 1602 and the scan lines 1603, and an intersection portion indicated by a region 1605 corresponds to one pixel.

Note that the scan lines 1603 are electrically connected at their ends to connection wirings 1608, and the connection wirings 1608 are connected to an FPC 1609b through an input terminal 1607. The data lines 1602 are connected to an FPC 1609a through an input terminal 1606.

If necessary, a polarizing plate, a circularly polarizing plate (including an elliptically polarizing plate), a retardation plate (a quarter-wave plate or a half-wave plate), or an optical film such as a color filter may be appropriately provided over a light-emitting surface. Further, the polarizing plate or the circularly polarizing plate may be provided with an anti-reflection film. For example, anti-glare treatment may be carried out by which reflected light can be diffused by projections and depressions on the surface so as to reduce the glare.

Through the above-described steps, the passive matrix light-emitting device can be manufactured. Application of the present invention makes it possible to easily form an organic compound layer included in a light-emitting element and to manufacture a light-emitting device including the light-emitting element. In addition, less complicated control is needed in the case where a light-emitting layer in which a dopant material is dispersed in a host material is formed than in the case where co-evaporation is applied. Moreover, since it is easy to control the additive amount of dopant material, or the like, deposition can be performed easily and precisely, and therefore desired emission color can be easily obtained. Furthermore, use efficiency of evaporation materials can be increased, and thus cost reduction can be realized.

Note that, although the example in which a driver circuit is not provided over the substrate is shown in FIG. 7, the present invention is not limited to the example and an IC chip including a driver circuit may be mounted on the substrate.

In the case where an IC chip is mounted, a data line side IC and a scan line side IC, in each of which a driver circuit for transmitting a signal to the pixel portion is formed, are mounted on the periphery of (outside) the pixel portion by a COG method. The mounting may be performed using a TCP or a wire bonding method other than the COG method. TCP is a TAB tape mounted with an IC, and the TAB tape is connected to a wiring over an element formation substrate to mount the IC. Each of the data line side IC and the scan line side IC may be formed using a silicon substrate. Alternatively, it may be that in which a driver circuit is formed using TFTs over a glass substrate, a quartz substrate, or a plastic substrate. Although described here is an example in which a single IC is provided on one side, a plurality of divided ICs may be provided on one side.

Next, an example of an active matrix light-emitting device which is manufactured by application of the present invention is described with reference to FIGS. 8A and 8B. Note that FIG. 8A is a top view showing a light-emitting device and FIG. 8B is a cross-sectional view taken along a chain line A-A' in FIG. 8A. The active matrix light-emitting device of this embodiment mode includes a pixel portion 1702 provided over an element substrate 1710, a driver circuit portion (a source side driver circuit) 1701, and a driver circuit portion (a gate side driver circuit) 1703. The pixel portion 1702, the driver circuit portion 1701, and the driver circuit portion 1703 are sealed, with a sealant 1705, between the element substrate 1710 and a sealing substrate 1704.

In addition, over the element substrate 1710, a lead wiring 1708 for connecting an external input terminal which transmits a signal (e.g., a video signal, a clock signal, a start signal, or a reset signal) or an electric potential to the driver circuit portion 1701 and the driver circuit portion 1703 is provided. In this embodiment mode, an example in which an FPC (flexible printed circuit) 1709 is provided as the external input terminal is shown. Note that, although only the FPC is shown in the drawing, the FPC may be provided with a PWB (printed wiring board). The light-emitting device in this specification includes, in its category, not only a light-emitting device itself but also a light-emitting device with an FPC or a PWB attached thereto.

Next, the cross-sectional structure is described with reference to FIG. 8B. Although the driver circuit portions and the pixel portion are formed over the element substrate 1710, in FIG. 8B, the pixel portion 1702 and the driver circuit portion 1701 which is the source side driver circuit are shown.

An example is shown in which a CMOS circuit which is the combination of an n-channel TFT 1723 and a p-channel TFT 1724 is formed as the driver circuit portion 1701. Note that a circuit included in the driver circuit portion may be a known CMOS circuit, PMOS circuit, or NMOS circuit. Although a driver-integrated type where the driver circuit is formed over the substrate is described in this embodiment mode, the present invention is not limited to this structure, and the driver circuit may be formed outside the substrate, not over the substrate.

The pixel portion 1702 includes a plurality of pixels, each of which includes a switching TFT 1711, a current-controlling TFT 1712, and a first electrode layer 1713, which is electrically connected to a wiring (a source electrode or a drain electrode) of the current-controlling TFT 1712. Note that an insulator 1714 is formed so as to cover end portions of the first electrode layer 1713. In this embodiment mode, the insulator 1714 is formed using a positive photosensitive acrylic resin.

The insulator 1714 is preferably formed so as to have a curved surface with curvature at an upper end portion or a lower end portion thereof in order to obtain favorable coverage by a film which is to be stacked over the insulator 1714. For example, in the case of using a positive photosensitive acrylic resin as a material for the insulator 1714, the insulator 1714 is preferably formed so as to have a curved surface with a curvature radius (0.2 to 3 μm) at the upper end portion thereof. Either a negative photosensitive material which becomes insoluble in an etchant by light irradiation or a positive photosensitive material which becomes soluble in an etchant by light irradiation can be used for the insulator 1714.

In addition, as the insulator 1714, without limitation to an organic compound, for example, an organic compound and/or an inorganic compound such as silicon oxide or silicon oxynitride can be used.

An EL layer 1700 including a light-emitting layer and a second electrode layer 1716 are stacked over the first electrode layer 1713. The first electrode layer 1713 corresponds to the above-described first electrode layer 302, and the second electrode layer 1716 corresponds to the above-described second electrode layer 306. Note that when an ITO film is used as the first electrode layer 1713, and a stacked film of a titanium nitride film and a film containing aluminum as its main component or a stacked film of a titanium nitride film, a film containing aluminum as its main component, and a titanium nitride film is used as a wiring of the current-controlling TFT 1712 which is connected to the first electrode layer 1713, resistance of the wiring is low and favorable ohmic contact with the ITO film can be obtained. Note that, although not shown in FIGS. 8A and 8B, the second electrode layer 1716 is electrically connected to the FPC 1709 which is an external input terminal.

In the EL layer 1700, at least the light-emitting layer is provided, and in addition to the light-emitting layer, a hole injecting layer, a hole transporting layer, an electron transporting layer, and/or an electron injecting layer are/is provided as appropriate. The first electrode layer 1713, the EL layer 1700, and the second electrode layer 1716 are stacked, whereby a light-emitting element 1715 is formed.

Although only one light-emitting element 1715 is shown in the cross-sectional view of FIG. 8B, a plurality of light-emitting elements is arranged in matrix in the pixel portion 1702. Light-emitting elements which provides three kinds of light emissions (R, G, and B) are selectively formed in the pixel portion 1702, whereby a light-emitting device which is capable of full color display can be manufactured. Alternatively, EL layers each including a light-emitting layer which emits light of the same color may be formed over an entire surface to provide a monochromatic light-emitting elements, whereby a light-emitting device which is capable of performing monochromatic display or a light-emitting device which is capable of performing area color display may be provided. Further alternatively, a light-emitting device which is capable of performing full color display may be provided by combination of a light-emitting device which provides white light emission with color filters.

Furthermore, the sealing substrate 1704 and the element substrate 1710 are attached to each other with the sealant 1705, whereby the light-emitting element 1715 is provided in a space 1707 surrounded by the element substrate 1710, the sealing substrate 1704, and the sealant 1705. Note that the space 1707 may be filled with the sealant 1705 as well as an inert gas (e.g., nitrogen or argon).

Note that an epoxy resin is preferably used as the sealant 1705. In addition, such a material is desirably a material which does not transmit moisture or oxygen as much as possible. As a material used for the sealing substrate 1704, a plastic substrate made of FRP (fiberglass-reinforced plastics), PVF (polyvinyl fluoride), polyester, acrylic, or the like can be used as well as a glass substrate or a quartz substrate.

As described above, the light-emitting device can be obtained by application of the present invention. Since TFTs are manufactured in an active matrix light-emitting device, manufacturing cost per light-emitting device tends to be high; however, applying the present invention makes it possible to drastically reduce loss of materials in forming light-emitting elements. Thus, reduction in cost can be achieved. In addition, applying the present invention makes it possible to easily form a light-emitting layer formed of a light-emitting material (a dopant material) which is dispersed in a host material and to easily control the amount of the contained light-emitting material.

Note that this embodiment mode can be combined with other embodiment modes described in this specification as appropriate.

Embodiment Mode 3

In this embodiment mode, an example of a deposition apparatus which makes it possible to manufacture a light-emitting device of the present invention will be described. FIGS. 9A to 9C and FIGS. 10A to 10C are each a schematic view of a cross section of a deposition apparatus of this embodiment mode.

Figure 9A:
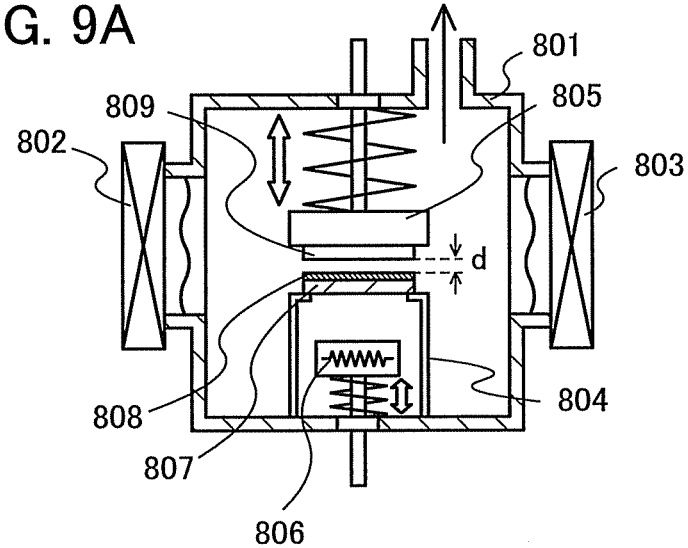
FIGS. 9A to 9C are diagrams each showing an example of a deposition apparatus.

In FIG. 9A, a deposition chamber 801 is a vacuum chamber, which is connected to other treatment chambers by a first gate valve 802 and a second gate valve 803. In addition, the deposition chamber 801 is provided with at least a substrate supporting unit, which is a first substrate supporting unit 804, a deposition substrate supporting unit, which is a second substrate supporting unit 805, and a heater which is capable of vertical movement as a heat source 806.

First, in another deposition chamber, a material layer 808 is formed over a first substrate 807 which is a supporting substrate. In this embodiment mode, the first substrate 807 corresponds to the first substrate 100 shown in FIGS. 1A and 1B, and the material layer 808 corresponds to the first organic compound layer 104. In this embodiment mode, a square, flat substrate containing copper as its main component is used as the first substrate 807. As the material layer 808, a mixed layer in which a plurality of materials which is capable of being evaporated and the evaporation temperature of which is different is mixed. Note that there are no particular limitations on the form of the first substrate 807 as long as the first substrate 807 has an area that is the same as or larger than that of the deposition substrate. In addition, there are no particular limitations on the formation method of the material layer 808 as long as the method is a wet method. A spin coating method, a printing method, an ink jet method, or the like is used.

The first substrate 807 is transferred from another deposition chamber to the deposition chamber 801 and is set on the substrate supporting unit. In addition, the first substrate 807 is fixed to the substrate supporting unit so that a surface of the first substrate 807, over which the material layer 808 is formed, and a surface of a second substrate 809 which is the deposition substrate face each other.

Figure 9B:
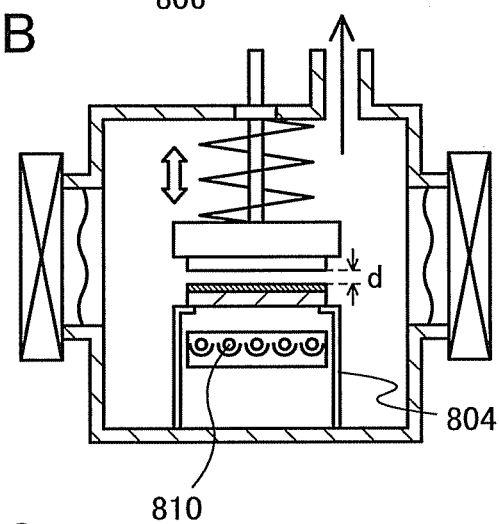
Figure 9C:
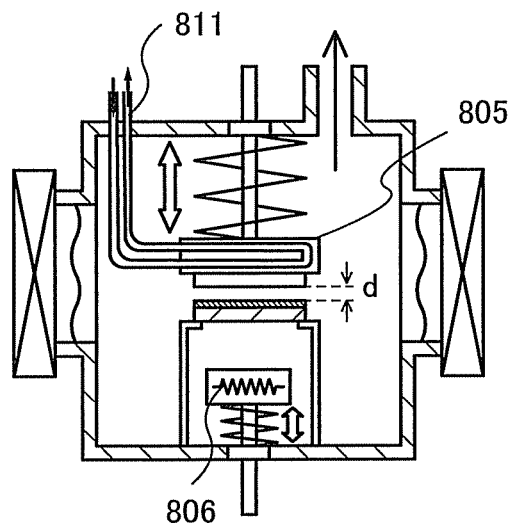

The second substrate supporting unit 805 is moved so that distance between the first substrate 807 and the second substrate 809 becomes distance d. Note that the distance d is defined as the distance between a surface of the material layer 808 formed over the first substrate 807 and a surface of the second substrate 809. In addition, in the case where any layer (e.g., a conductive layer which functions as an electrode or an insulating layer which functions as a partition wall) is formed on the second substrate 809, the distance d is defined as the distance between the surface of the material layer 808 formed over the first substrate 807 and a surface of the layer formed on the second substrate 809. Note that the surface of the second substrate 809 or the surface of the layer formed on the second substrate 809 is uneven, the distance d is defined as the shortest distance between the surface of the material layer 808 formed over the first substrate 807 and the second substrate 809 or an outermost surface of the layer formed on the second substrate 809. In this embodiment mode, the distance d is set to 2 mm. In addition, if the second substrate 809 is hard like a quartz substrate and formed of a material which is not deformed (warped, bent, or the like) much, the distance d can be shortened to 0 mm as the minimum distance. Although an example in which the deposition substrate supporting unit is moved while the substrate supporting unit is fixed for controlling the distance between the substrates is shown in FIGS. 9A to 9C, a structure may also be employed in which the substrate supporting substrate is moved while the deposition substrate supporting unit is fixed. Alternatively, both the substrate supporting unit and the deposition substrate supporting unit may be moved. Note that, FIG. 9A shows a cross section of a step in which the second substrate supporting unit 805 is moved so that the first substrate 807 and the second substrate 809 are brought close to each other to have the distance d therebetween.

Alternatively, a structure may also be employed in which the substrate supporting unit and the deposition substrate supporting unit move not only in a vertical direction but also in a horizontal direction and precise alignment is performed. In addition, the deposition chamber 801 may include an alignment mechanism such as CCD for precise alignment or measurement of the distance d. In addition, a sensor for measuring the temperature or humidity inside the deposition chamber 801 may be provided.

The heat source 806 is brought close to the supporting substrate while retaining the distance d between the substrates. Note that it is desirable that the contact area of the heat source 806 with the supporting substrate be large for uniform heating. In FIG. 9A, a heater which is capable of vertical movement is used below the supporting substrate.

When the heat source 806 is brought close to the supporting substrate, the material layer 808 over the supporting substrate is heated to be vaporized in a short time by direct heat conduction, whereby evaporation materials are deposited on the surface of the deposition substrate (that is, a bottom surface) of the second substrate 809, which is placed so as to face the supporting substrate. In the deposition apparatus shown in FIG. 9A, if the material layer 808 with uniform thickness is obtained over the first substrate 807 in advance, the film is deposited to a uniform thickness on the second substrate without setting a film-thickness monitor. A substrate is rotated in a conventional evaporation apparatus. In the deposition apparatus shown in FIG. 9A, on the other hand, deposition is performed while the deposition substrate is not rotated but fixed, and thus the deposition apparatus is suitable for deposition on a large-area glass substrate which is easily broken. In addition, in the deposition apparatus shown in FIG. 9A, the supporting substrate is also not rotated but fixed during deposition.

The distance between the heat source 806 and the first substrate 807 (supporting substrate) may be kept long while waiting (before deposition treatment) in order to reduce the effect of heat on the material layer 808 over the supporting substrate due to radiation of the heat source (heater) while waiting.

The deposition apparatus shown in FIG. 9A is capable of more drastic reduction in the capacity of the chamber in comparison with a conventional evaporation apparatus. Moreover, an openable and closeable shutter for heat insulating may be provided between the heat source 806 and the first substrate 807 (supporting substrate) in order to reduce the capacity of the chamber.

The heat source 806 is not limited to a heater, and any heating unit may be used as long as the heating unit can perform uniform heating in a short time. For example, a lamp 810 may be provided as shown in FIG. 9B. Note that the same reference numeral is used in FIG. 9B to denote components in common with FIG. 9A. In an example shown in FIG. 9B, the lamp 810 is fixed below a first substrate and a film is deposited on a bottom surface of a second substrate 809 immediately after the lamp 810 is lit. Note that FIG. 9B shows a cross section of a step, before the lamp 810 is lit up, in which the first substrate and the second substrate are brought close to each other to the substrate distance d therebetween.

As the lamp 810, the following can be used: an electric-discharge lamp such as a flash lamp (e.g., a xenon flash lamp or a krypton flash lamp), a xenon lamp, or a metal halide lamp, or an exothermic lamp such as a halogen lamp or a tungsten lamp. Since a flash lamp is capable of emitting very high-intensity light repeatedly to a large area for a short time (0.1 to 10 msec), it can uniformly and efficiently heat the substrate regardless of the area of the first substrate. In addition, heating of the first substrate can be controlled by change of interval of light emission of a flash lamp. Moreover, since the life of a flash lamp is long and power consumption thereof while waiting for light emission is low, running cost can be kept low. Furthermore, using a flash lamp makes it possible to easily perform rapid heating and to simplify a vertical mechanism unit, a shutter, or the like in the case where a heater is used. Thus, further reduction in the size of the deposition apparatus can be realized.

Although FIG. 9B shows the example in which the lamp 810 is set in the deposition chamber 801, part of an inner wall of the deposition chamber may be made of a light-transmitting member so that the lamp 810 is placed outside the deposition chamber. The lamp 810 is placed outside the deposition chamber, whereby maintenance such as replacement of light bulbs of the lamp 810 can be easier.

FIG. 9C shows an example of a deposition apparatus provided with a mechanism for controlling the temperature of the second substrate 809. The same reference numeral is used in FIG. 9C to denote components in common with FIGS. 9A and 9B. In FIG. 9C, a tube 111 through which a refrigerant flows to a second substrate supporting unit 805 is provided. The second substrate supporting unit 805 can be a cold plate by the tube 111 through which a refrigerant flows. The tube 111 has a mechanism in which it can follow the vertical movement of the second substrate supporting unit 805. Note that, although an example in which the tube 111 through which a refrigerant gas or a liquid refrigerant flows is used is described in this embodiment mode, a peltiert element or the like as a cooling unit may be provided for the second substrate supporting unit 805.

The deposition apparatus shown in FIG. 9C is useful for stacking material layers, evaporation materials of which are different. For example, in the case where a first material layer has been formed on the second substrate, a second material layer the evaporation temperature of which is higher than that of the first material layer can be stacked on the first material layer. In FIG. 9A, since the second substrate and the first substrate are close to each other, the first material layer which has been formed on the second substrate could be vaporized. However, when the deposition apparatus shown in FIG. 9C is used, the second material layer can be stacked on the first material layer which has been formed on the second substrate while vaporization of the first material layer is suppressed using a cooling unit.

In addition, the second substrate supporting unit 805 may be provided with a heating unit such as a heater, in addition to the cooling unit. A unit for controlling the temperature of the second substrate (heating or cooling) can prevent warp or the like of the substrate.

Figure 10A:
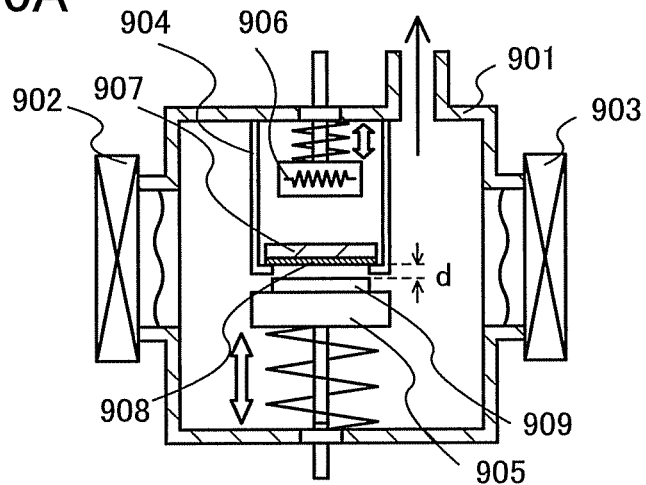
FIGS. 10A to 10C are diagrams each showing an example of a deposition apparatus.
Figure 10B:
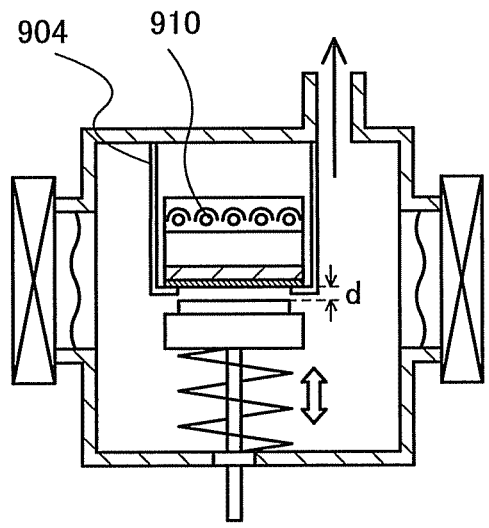

Note that, although FIGS. 9A to 9C each show the example of the deposition apparatus employing a face-down system in which the deposition surface of the deposition substrate faces downward, a deposition apparatus employing a face-up system as shown in FIGS. 10A and 10B may be applied.

In FIG. 10A, a deposition chamber 901 is a vacuum chamber, which is connected to other treatment chambers by a first gate valve 902 and a second gate valve 903. In addition, the deposition chamber 901 is provided with at least a deposition substrate supporting unit, which is a first substrate supporting unit 905, a substrate supporting unit, which is a second substrate supporting unit 904, and a heater which is capable of vertical movement as a heat source 806.

The procedure of deposition is hereinafter described. First, in another deposition chamber, a material layer 908 is formed over a second substrate 907 which is a supporting substrate. In this embodiment mode, the second substrate 907 corresponds to the first substrate 100 shown in FIGS. 1A and 1B. There are no particular limitations on the form of the second substrate 907 as long as the second substrate 907 has an area that is the same as or larger than that of the deposition substrate. The material layer 908 corresponds to the first organic compound layer 104 and contains a plurality of materials which is capable of being evaporated and the evaporation temperature of which is different. There are no particular limitations on the formation method of the material layer 908 as long as the method is a wet method. A spin coating method, a printing method, an ink jet method, or the like is used.

The second substrate 907 is transferred from another deposition chamber to the deposition chamber 901 and is set on the substrate supporting unit. In addition, the second substrate 907 is fixed to the substrate supporting unit so that a surface of the second substrate 907, over which the material layer 908 is formed, and a surface of a first substrate 909 face each other. In addition, as shown in FIG. 10A, this structure is an example of a face-up system in which the deposition surface of the substrate face upward. In the case of the face-up system, a large-area glass substrate which is easily bent is put on a flat board, or the glass substrate is supported by a plurality of pins, whereby the substrate has no flexure; accordingly, a deposition device can be realized in which a uniform thickness over an entire surface of the substrate can be obtained.

The first substrate supporting unit 905 is moved so that distance between the second substrate 907 and the first substrate 909 becomes distance d. Note that the distance d is defined as the distance between a surface of the material layer 908 formed on the second substrate 907 and a surface of the first substrate 909. In addition, in the case where any layer (e.g., a conductive layer which functions as an electrode or an insulating layer which functions as a partition wall) is formed over the first substrate 909, the distance d is defined as the distance between the surface of the material layer 908 formed on the second substrate 907 and a surface of the layer formed over the first substrate 909. Note that the surface of the first substrate 909 or the surface of the layer formed over the first substrate 909 is uneven, the distance d is defined as the shortest distance between the surface of the material layer 908 formed on the second substrate 907 and the first substrate 909 or an outermost surface of the layer formed over the first substrate 909. In this embodiment, the distance d is set to 5 mm. In addition, although the example is described in which the deposition substrate supporting unit is moved while the substrate supporting unit is fixed, the substrate supporting unit may be moved while the deposition substrate supporting unit is fixed. Moreover, the distance d may be controlled in such a manner that both the substrate supporting unit and the deposition substrate supporting unit are moved.

As shown in FIG. 10A, a heat source 906 is brought close to the supporting substrate while retaining the distance d between the substrates. Note that it is desirable that the contact area of the heat source 906 with the supporting substrate be large for uniform heating. In FIG. 10A, a heater which is capable of vertical movement is used above the supporting substrate.

When the heat source 906 is brought close to the supporting substrate, the material layer 908 on the supporting substrate is heated to be vaporized in a short time by direct heat conduction, whereby evaporation materials are deposited on a deposition surface (that is, an upper surface) of the first substrate 909, which is placed so as to face the supporting substrate. This makes it possible to realize a small-sized deposition apparatus the capacity of which is drastically smaller than that of a conventional evaporation apparatus which is a large-capacity chamber.

The heat source 906 is not limited to a heater, and any heating unit may be used as long as the heating unit can perform uniform heating in a short time. For example, a lamp 910 may be provided as shown in FIG. 10B. Note that the same reference numeral is used in FIG. 10B to denote components in common with FIG. 10A. In an example shown in FIG. 10B, the lamp 910 is fixed above a second substrate and a film is deposited over an upper surface of a first substrate 909 immediately after the lamp 810 is lit up.

Figure 10C:
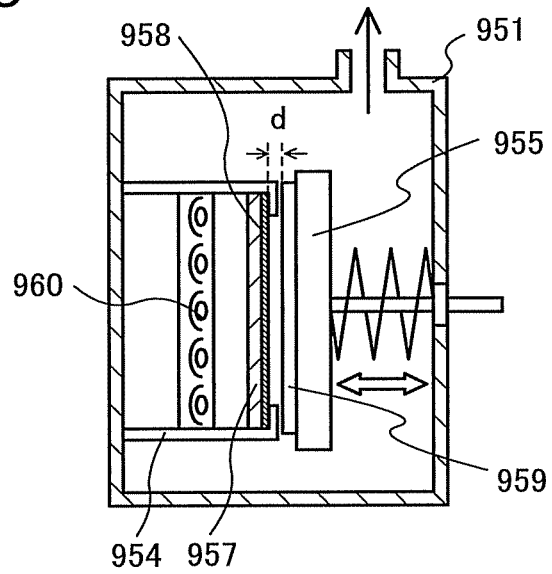

Note that, although FIGS. 9A to 9C and FIGS. 10A and 10B each show the example of the deposition apparatus employing a system in which substrates are arranged horizontally, a deposition apparatus employing a system in which substrates are arranged vertically as shown in FIG. 10C can also be applied.

In FIG. 10C, a deposition chamber 951 is a vacuum chamber. In addition, the deposition chamber 951 is provided with at least a substrate supporting unit, which is a first substrate supporting unit 954, a deposition substrate supporting unit, which is a second substrate supporting unit 955, and a lamp 960 as a heat source.

Although not shown, the deposition chamber 951 is connected to a first transfer chamber to which the deposition substrate is transferred while keeping its vertical arrangement and to a second transfer chamber to which the supporting substrate is transferred while keeping its vertical arrangement. In this specification, vertical arrangement of a substrate refers to placement of a substrate in which a substrate surface makes an angle which is nearly vertical (ranging from 70 to 100°) with a horizontal surface. Since a large-area glass substrate or the like is easy to bend, it is desirably transferred with the vertical arrangement.

The lamp 960 is more suitable than a heater as the heat source, for heating a large-area glass substrate.

The procedure of deposition is hereinafter described. First, in another deposition chamber, a material layer 958 is formed over one of surfaces of a first substrate 957, which is a supporting substrate. The first substrate 957 corresponds to the first substrate 100 shown in FIGS. 1A and 1B, and the material layer 958 corresponds to the first organic compound layer 104.

Next, the first substrate 957 is transferred from another deposition chamber to the deposition chamber 951 and is set on the substrate supporting unit. In addition, the first substrate 957 is fixed to the substrate supporting unit so that the surface of the first substrate 957, over which the material layer 958 is formed, and the deposition surface of a second substrate 959 face each other.

Next, light is emitted from the lamp 960 to rapidly heat the supporting substrate, while retaining the distance d between the substrates. When the supporting substrate is rapidly heated, the material layer 958 over the supporting substrate is heated to be vaporized in a short time by indirect heat conduction, whereby evaporation materials are deposited on the deposition surface of the second substrate 959, which is the deposition substrate placed to face the supporting substrate. This makes it possible to realize a small-sized deposition apparatus the capacity of which is drastically smaller than that of a conventional evaporation apparatus which is a large-capacity chamber.

A plurality of deposition apparatuses described in this embodiment mode may be provided, whereby a multi-chamber manufacturing apparatus can be obtained. Needless to say, the deposition apparatus can be combined with a deposition apparatus employing another deposition method. Alternatively, a plurality of deposition apparatuses described in this embodiment mode may be arranged in series, whereby an in-line manufacturing apparatus can be obtained.

In addition, deposition treatment can also be performed in such a manner that, in the deposition apparatuses shown in FIGS. 9A to 9C and FIGS. 10A to 10C, a conductive substrate is used as each of the supporting substrates which are the first substrate 807, the second substrate 907, and the first substrate 957, current is passed through the supporting substrate to heat the supporting substrate. In this case, the supporting substrate itself functions as part of a heat source.

Using such a deposition apparatus makes it possible to manufacture the light-emitting device of the present invention. In the present invention, the evaporation source can be easily prepared by a wet method. In addition, since the evaporation source can be evaporated as it is, a film-thickness monitor is not needed. Therefore, the deposition process can be fully automated, and accordingly throughput can be increased. Moreover, evaporation materials can be prevented from being attached to an inner wall of a deposition chamber, and accordingly maintenance of the deposition apparatus can be easier.

Note that this embodiment mode can be combined with other embodiment modes described in this specification as appropriate.

Embodiment Mode 4

In this embodiment mode, with reference to FIGS. 11A to 11E, a variety of electronic appliances which are completed by use of a light-emitting device manufactured by application of the present invention will be described.

As electronic appliances to which the light-emitting device of the present invention is applied, the following are given: televisions, cameras such as video cameras or digital cameras, goggle type displays (head mount displays), navigation systems, audio reproducing devices (e.g., car audio component stereos and audio component stereos), laptop personal computers, game machines, portable information terminals (e.g., mobile computers, cellular phones, portable game machines, and electronic books), and image reproducing devices provided with recording media (specifically, the devices that can reproduce a recording medium such as a digital versatile disc (DVD) and is provided with a display device capable of displaying the reproduced images), lighting equipment, and the like. Specific examples of these electronic appliances are shown in FIGS. 11A to 11E.

FIG. 11A shows a display device, which includes a chassis 8001, a supporting base 8002, a display portion 8003, speaker portions 8004, video input terminals 8005, and the like. The display device is manufactured using a light-emitting device manufactured using the present invention for the display portion 8003. Note that the display device includes all devices for displaying information in its category, for example, devices for a personal computer, for receiving TV broadcasting, and for displaying an advertisement. Application of the present invention makes it possible to increase throughput, and thus productivity in manufacturing the display device can be improved. In addition, loss of materials in manufacturing the display device can be reduced, and thus manufacturing costs can be reduced and inexpensive display devices can be provided.

FIG. 11B shows a laptop personal computer, which includes a main body 8101, a chassis 8102, a display portion 8103, a keyboard 8104, an external connection port 8105, a mouse 8106, and the like. The laptop personal computer is manufactured using a light-emitting device manufactured using the present invention is used for the display portion 8103. Application of the present invention makes it possible to increase throughput, and thus productivity in manufacturing the display device can be improved. In addition, loss of materials in manufacturing the display device can be reduced, and thus manufacturing costs can be reduced and inexpensive laptop personal computers can be provided.

FIG. 11C shows a video camera, which includes a main body 8201, a display portion 8202, a chassis 8203, an external connection port 8204, a remote control receiving portion 8205, an image receiving portion 8206, a battery 8207, an audio input portion 8208, operation keys 8209, an eyepiece portion 8210, and the like. The video camera is manufactured using a light-emitting device manufactured using the present invention for the display portion 8202. Application of the present invention makes it possible to increase throughput, and thus productivity in manufacturing the display device can be improved. In addition, loss of materials in manufacturing the display device can be reduced, and thus manufacturing costs can be reduced and inexpensive video cameras can be provided.

FIG. 11D shows a desk lighting equipment, which includes a lighting portion 8301, a shade 8302, an adjustable arm 8303, a support 8304, a base 8305, and a power supply 8306. The desk lighting equipment is manufactured using a light-emitting device manufactured using the present invention for the lighting portion 8301. Note that the lighting equipment includes a ceiling-fixed lighting equipment, a wall-hanging lighting equipment, and the like in its category. Application of the present invention makes it possible to increase throughput, and thus productivity in manufacturing the display device can be improved. In addition, loss of materials in manufacturing the display device can be reduced, and thus manufacturing costs can be reduced and inexpensive desk lighting equipment can be provided.

FIG. 11E shows a cellular phone, which includes a main body 8401, a chassis 8402, a display portion 8403, an audio input portion 8404, an audio output portion 8405, operation keys 8406, an external connection port 8407, an antenna 8408, and the like. The cellular phone is manufactured using a light-emitting device manufactured using the present invention for the lighting portion 8403. Application of the present invention makes it possible to increase throughput, and thus productivity in manufacturing the display device can be improved. In addition, loss of materials in manufacturing the display device can be reduced, and thus manufacturing costs can be reduced and inexpensive cellular phones can be provided.

In the above-described manner, electronic appliances or lighting equipment can be obtained by application of the light-emitting device of the present invention. The application range of the light-emitting device of the present invention is so wide that the light-emitting device can be applied to electronic appliances in various fields.

Note that this embodiment mode can be combined with other embodiment modes described in this specification as appropriate.

Embodiment 1

Figure 12A:
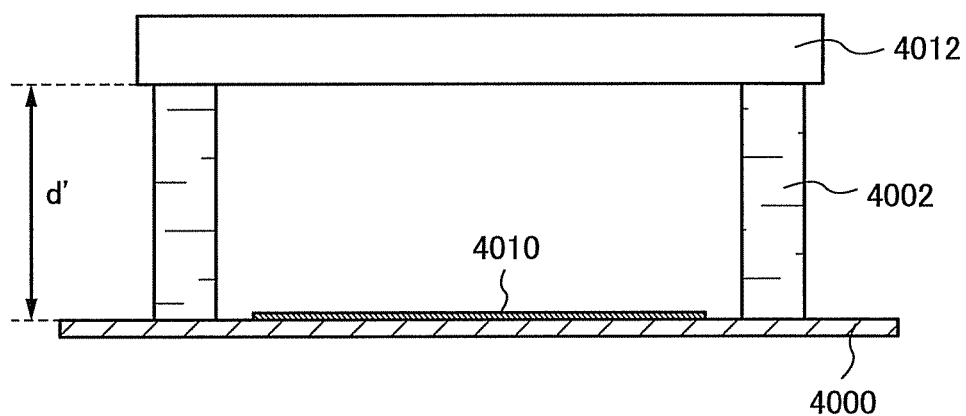
FIGS. 12A and 12B are schematic views each showing a cross section of a deposition process of Embodiment 1.
Figure 12B:
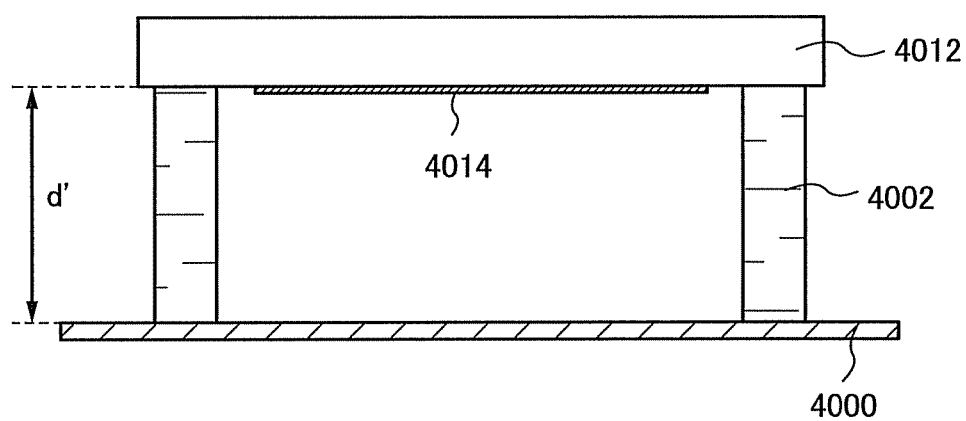
Figure 13:
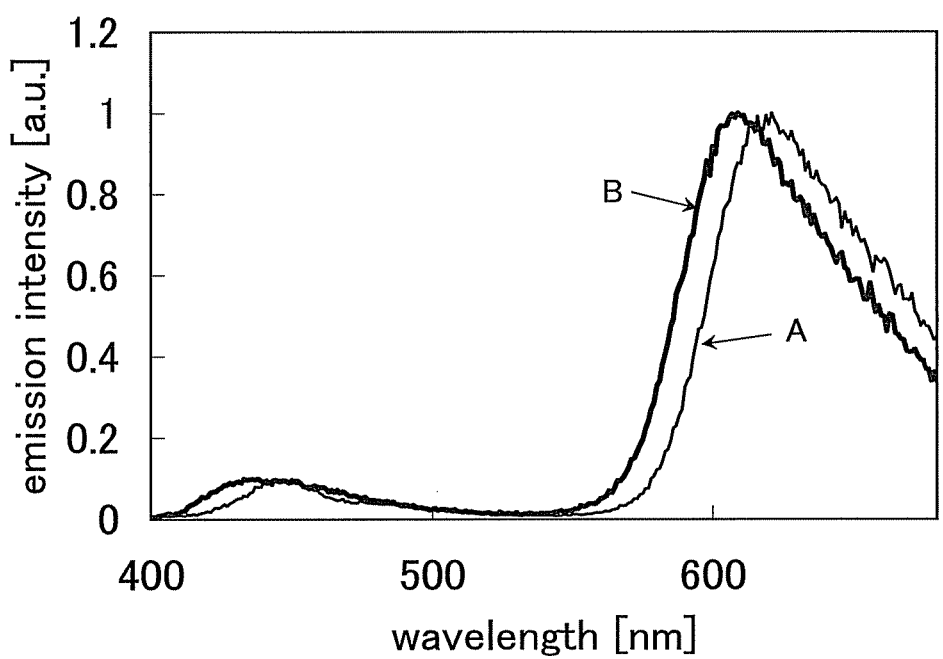
FIG. 13 is a graph showing light emission spectrum of Embodiment 1.

With reference to FIGS. 12A and 12B and FIG. 13, the experiment in which an organic compound layer in which a dopant material was dispersed in a host material was actually formed and the state where the dopant material was uniformly dispersed in the host material was confirmed will be described.

First, 0.1 g of NPB as the host material and 0.005 g of Ir(tppr)$_2$(acac) as the dopant material were prepared, and 10 g of toluene which was a solvent was mixed thereinto. In addition, a substrate containing tungsten as its main component, which has a thickness of 0.2 mm and an area of 90 mm×90 mm, was prepared as a first substrate 4000, which was a supporting substrate.

The mixed solution containing NPB and Ir(tppr)$_2$(acac) was dropped on the first substrate 4000 by a spin coating method to form a first organic compound layer 4010. The periphery of the first substrate 4000 was wiped with a cloth soaked with acetone to remove the first organic compound layer 4010 in the periphery of the first substrate 4000. At this time, the first organic compound layers 4010 attached to a rear surface and a side surface of the first substrate 4000 were also removed.

Next, a quartz substrate was prepared as a second substrate 4012 which was a deposition substrate. Then, as shown in FIG. 12A, the second substrate 4012 was placed so as to face a surface of the first substrate 4000, which is provided with the first organic compound layer 4010. At this time, spacers 4002 were provided between the first substrate 4000 and the second substrate 4012, and distance d' between the first substrate 4000 and the second substrate 4012 was set to 1.4 mm. Two glass chips each having a thickness of 0.7 mm were stacked to be used as each spacer 4002. In addition, the spacers 4002 were provided for the periphery of the first substrate 4000 where the first organic compound layer 4010 had been removed.

Next, DC voltage was applied to the first substrate 4000, and current of 14.5 A was passed through the first substrate 4000 for about one minute. In this step, the current was passed while two portions of the periphery of the first substrate 4000 were each interposed between conductive electrode plates. As a result, the first organic compound layer 4010 was heated to be vaporized, whereby a second organic compound layer 4014 was formed on the second substrate 4012 as shown in FIG. 12B. Note that the second organic compound layer 4014 formed on the second substrate 4012 was formed to have an area that is the same as the area of the first organic compound layer 4010 where the first organic compound layer 4010 in the periphery of the first substrate 4000 had been removed.

FIG. 13 is a graph showing an emission spectrum A of the first organic compound layer 4010 in the toluene solution state and an emission spectrum B of the second organic compound layer 4014 in the thin-film state. In FIG. 13, the horizontal axis indicates the wavelength (nm) and the vertical axis indicates the emission intensity (arbitrary unit). According to the emission spectrum A and the emission spectrum B shown in FIG. 13, the NPB-derived peak and the Ir(tppr)$_2$(acac)-derived peak can be confirmed. It is found that the ratio between the peak intensities of NPB and Ir(tppr)$_2$(acac) in the spectrum A is approximately the same as the ratio between the peak intensities of NPB and Ir(tppr)$_2$(acac) in the spectrum B.

Consequently, it was found that, in the second organic compound layer 4014, similarly to the solution state, the dopant material is uniformly dispersed in the host material.

Embodiment 2

The experiment will be described in which an organic compound layer in which a dopant material was dispersed in a host material was actually formed by application of the present invention, and by which it was confirmed that the mixture of the host material and the dopant material could be deposited at a temperature lower than the evaporation temperature of the dopant material.

First, 0.1 g of NPB as the host material and 0.01 g of Ir(tppr)$_2$(acac) as the dopant material were prepared, and 10 g of chloroform which was a solvent was mixed thereinto. In addition, a substrate containing silver as its main component, which has a thickness of 0.05 mm and an area of 50 mm×50 mm, was prepared as a first substrate 5000, which was a supporting substrate.

A mixed solution containing NPB and Ir(tppr)$_2$(acac) was dropped on the first substrate 5000 by a spin coating method to form a first organic compound layer 5010. The periphery of the first substrate 5000 was wiped with a cloth soaked with acetone to remove the first organic compound layer 5010 in the periphery of the first substrate 5000. At this time, the first organic compound layers 5010 attached to a rear surface and a side surface of the first substrate 5000 were also removed.

Figure 15A:
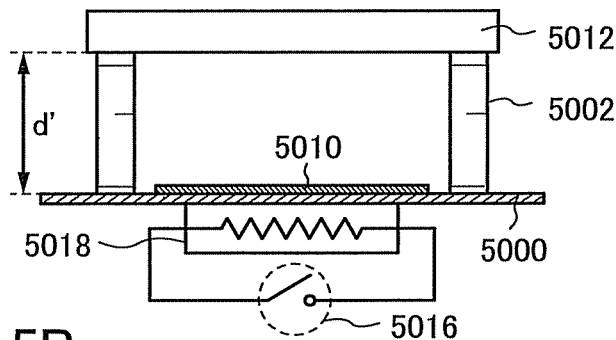
FIGS. 15A to 15D are schematic views each showing a cross section of a deposition process of Embodiment 2.

Next, a quartz substrate was prepared as a second substrate 5012, which was a deposition substrate. Then, as shown in FIG. 15A, the second substrate 5012 was placed so as to face a surface of the first substrate 5000, which is provided with the first organic compound layer 5010. The first substrate 5000 was placed over a heater 5018 whose switch 5016 was turned off. Note that a power supply of the heater 5018 is not shown in the drawing. In addition, spacers 5002 were provided between the first substrate 5000 and the second substrate 5012, and distance d' between the first substrate 5000 and the second substrate 5012 was set to 1.4 mm. Two glass chips each having a thickness of 0.7 mm were stacked to be used as each spacer 5002. In addition, the spacers 5002 were provided for the periphery of the first substrate 5000 where the first organic compound layer 5010 had been removed.

Figure 15B:
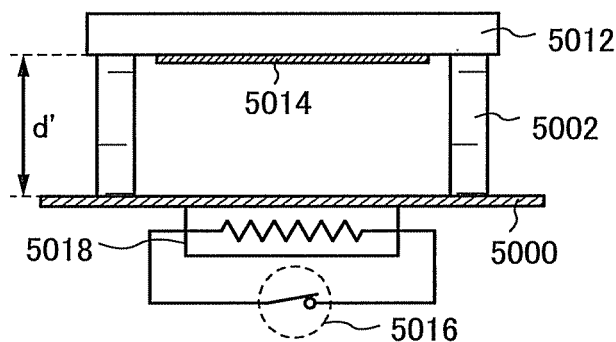

Next, as shown in FIG. 15B, the switch 5016 was turned on and the temperature of the heater 5018 was set at about 300° C. to heat the first organic compound layer 5010, whereby a second organic compound layer 5014 was formed over the second substrate 5012. Note that the second organic compound layer 5014 formed on the second substrate 5012 was formed to have an area that is the same as the area of the first organic compound layer 5010 where the first organic compound layer 5010 in the periphery of the first substrate 5000 had been removed.

Next, the experiment in which an organic compound layer containing only a dopant material was formed will be described. Note that a first substrate 5200, a second substrate 5212, spacers 5202, a heater 5218, and a switch 5216 correspond to the first substrate 5000, the second substrate 5012, the spacers 5002, the heater 5108, and the switch 5016, respectively.

Only 0.1 g of Ir(tppr)$_2$(acac) which had been used as the dopant material in the previous experiment was prepared, and 10 g of chloroform which was a solvent was mixed thereinto. The mixed solution was dropped on the first substrate 5200 by a spin coating method to form a first organic compound layer 5210. The periphery of the first substrate 5200 was wiped with a cloth soaked with acetone to remove the first organic compound layer 5010 in the periphery of the first substrate 5200. At this time, the first organic compound layers 5010 attached to a rear surface and a side surface of the first substrate 5200 were also removed.

Figure 15C:
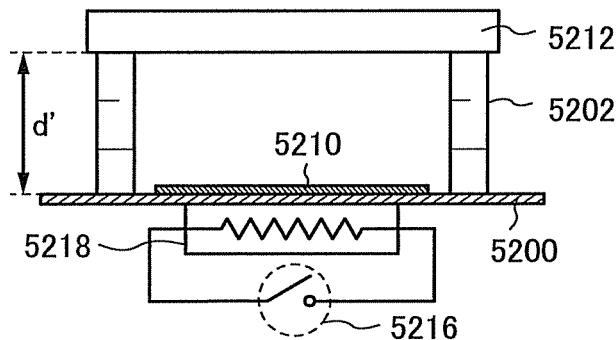

Next, as shown in FIG. 15C, the second substrate 5212 was placed so as to face a surface of the first substrate 5200, which was provided with the first organic compound layer 5210. The first substrate 5200 was placed over a heater 5218 whose switch 5216 was turned off. Note that a power supply of the heater 5218 is not shown in the drawing. In addition, spacers 5202 were provided between the first substrate 5200 and the second substrate 5212, and distance d' between the first substrate 5200 and the second substrate 5212 was set to 1.4 mm. In addition, the spacers 5202 were provided for the periphery of the first substrate 5200 where the first organic compound layer 5210 had been removed.

Figure 15D:
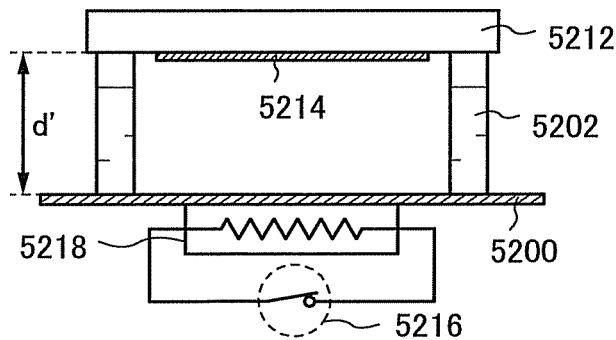

Next, as shown in FIG. 15D, the switch 5216 was turned on to heat the first organic compound layer 5210. The first organic compound layer 5210 started to be evaporated when the temperature of the heater 5218 reached about 350° C. The first organic compound layer 5210 was heated while keeping the temperature of the heat at about 350° C. for 30 minutes or more, whereby a second organic compound layer 5214 was formed on the second substrate 5212. Note that the second organic compound layer 5214 formed on the second substrate 5212 was formed to have an area that is the same as the area of the first organic compound layer 5210 where the first organic compound layer 5210 in the periphery of the first substrate 5200 had been removed.

Consequently, it was found that the organic compound layer could be evaporated at a lower heating temperature in the case where the organic compound layer in which Ir(tppr)$_2$(acac) which was the dopant material had been dispersed in the host material was evaporated than in the case where the organic compound layer containing only the dopant material was deposited.

In addition, Ir(tppr)$_2$(acac) which was used as the dopant material is a light-emitting material which has excellent characteristics and emits red light. However, there has been a problem in that, since the vaporization temperature (sublimation temperature) of Ir(tppr)$_2$(acac) is 320° C. and the decomposition temperature thereof is 330° C., which are very close to each other, most of Ir(tppr)$_2$(acac) is decomposed without being deposited when Ir(tppr)$_2$(acac) is deposited by a conventional deposition method using a deposition boat, a crucible, or the like. However, it was found that when the present invention was applied, the heating temperature in deposition treatment could be low, and therefore a film in which Ir(tppr)$_2$(acac) which was a dopant material was dispersed in NPB which was a host material could be deposited without being decomposed could be deposited. Thus, it was found that the present invention is especially useful in deposition of a material which is difficult to control when it is by itself, for example, deposition of a material, the evaporation temperature and the decomposition temperature of which are close to each other.

This application is based on Japanese Published Patent Application serial no. 2007-119996 filed with Japan Patent Office on Apr. 27, 2007, the entire contents of which are hereby incorporated by reference.

What is claimed is:

1. A method for manufacturing a light-emitting device comprising:
 applying a first organic compound layer containing at least a first evaporation material having a first evaporation temperature and a second evaporation material having a second evaporation temperature on a first substrate wherein the second evaporation temperature is higher than the first evaporation temperature;

placing a second substrate provided with a first electrode at a position facing the first substrate so that the first electrode and the first organic compound layer face each other;

forming a second organic compound layer on the first electrode provided for the second substrate by heating of the first organic compound layer at a temperature lower than the second evaporation temperature so that the first organic compound layer is vaporized; and forming a second electrode over the second organic compound layer.

2. The method for manufacturing a light-emitting device according to claim 1, wherein the first organic compound layer is formed by a wet method.

3. The method for manufacturing a light-emitting device according to claim 1, wherein the second organic compound layer includes the first evaporation material and the second evaporation material.

4. The method for manufacturing a light-emitting device according to claim 1, wherein the second substrate is placed so that a method for manufacturing distance between a surface of the first organic compound layer and a surface of the second substrate becomes greater than or equal to 0 mm and less than or equal to 50 mm.

5. The method for manufacturing a light-emitting device according to claim 1, wherein a temperature of the second substrate is controlled during heating of the first organic compound layer.

6. A method for manufacturing a light-emitting device comprising:

applying a first organic compound layer containing at least a host material and a dopant material having an evaporation temperature higher than an evaporation temperature of the host material on a first substrate;

placing a second substrate provided with a first electrode at a position facing the first substrate so that the first electrode and the first organic compound layer face each other;

forming a second organic compound layer on the first electrode provided for the second substrate by heating of the first organic compound layer at a temperature equal to or higher than the evaporation temperature of the host material and lower than the evaporation temperature of the dopant material so that the first organic compound layer is vaporized; and forming a second electrode over the second organic compound layer.

7. The method for manufacturing a light-emitting device according to claim 6, wherein a material having an evaporation temperature lower than a decomposition temperature of the dopant material is used as the host material.

8. The method for manufacturing a light-emitting device according to claim 6, wherein the first organic compound layer is formed by a wet method.

9. The method for manufacturing a light-emitting device according to claim 6, wherein the second organic compound layer contains the dopant material and the host material.

10. The method for manufacturing a light-emitting device according to claim 6, wherein the second substrate is placed so that a distance between a surface of the first organic compound layer and a surface of the second substrate becomes greater than or equal to 0 mm and less than or equal to 50 mm.

11. The method for manufacturing a light-emitting device according to claim 6, wherein a temperature of the second substrate is controlled during heating of the first organic compound layer.

12. A method for manufacturing a light-emitting device comprising:

applying a first organic compound layer containing at least a host material and a dopant material having a decomposition temperature higher than an evaporation temperature of the host material on a first substrate;

placing a second substrate provided with a first electrode at a position facing the first substrate so that the first electrode and the first organic compound layer face each other;

forming a second organic compound layer on the first electrode provided for the second substrate by heating of the first organic compound layer at a temperature equal to hither than the evaporation temperature and lower than the decomposition temperature so that the first organic compound layer is vaporized; and forming a second electrode over the second organic compound layer.

13. The method for manufacturing a light-emitting device according to claim 12, wherein the first organic compound layer is formed by a wet method.

14. The method for manufacturing a light-emitting device according to claim 12, wherein the second organic compound layer contains the dopant material and the host material.

15. The method for manufacturing a light-emitting device according to claim 12, wherein the second substrate is placed so that a distance between a surface of the first organic compound layer and a surface of the second substrate becomes greater than or equal to 0 mm and less than or equal to 50 mm.

16. The method for manufacturing a light-emitting device according to claim 12, wherein a temperature of the second substrate is controlled during heating of the first organic compound layer.

* * * * *